United States Patent
Xiao et al.

(10) Patent No.: US 10,958,488 B2
(45) Date of Patent: Mar. 23, 2021

(54) SIGNAL TRANSMISSION METHOD AND SYSTEM

(71) Applicant: HUAWEI TECHNOLOGIES CO., LTD., Guangdong (CN)

(72) Inventors: Zhiyu Xiao, Chengdu (CN); Mo Li, Chengdu (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/786,566

(22) Filed: Feb. 10, 2020

(65) Prior Publication Data
US 2020/0186402 A1  Jun. 11, 2020

Related U.S. Application Data

(63) Continuation of application No. PCT/CN2017/097185, filed on Aug. 11, 2017.

(51) Int. Cl.
*H03H 7/30* (2006.01)
*H04L 25/03* (2006.01)
(Continued)

(52) U.S. Cl.
CPC ...... *H04L 25/03898* (2013.01); *H04B 10/25* (2013.01); *H04L 1/0057* (2013.01); *H04B 10/61* (2013.01)

(58) Field of Classification Search
CPC ......... H04L 25/03057; H04L 25/03038; H04L 47/38; H04L 45/64; H04L 27/2032; H04L 1/0054; H04L 1/006; H04B 7/0413
(Continued)

(56) References Cited

U.S. PATENT DOCUMENTS 8,175,466 B2    5/2012  Djordjevic et al.
8,611,480 B1 *  12/2013 Lee .................. H04L 1/0631
                                                    375/260
(Continued)

FOREIGN PATENT DOCUMENTS

CN  1771671 A   5/2006
CN  102394843 A 3/2012
(Continued)

OTHER PUBLICATIONS

Dario Fertonani et al:"Reduced-Complexity BCJR Algorithm for Turbo Egualization",Dec. 1, 2007 (Dec. 1, 2007),pp. 2279-2287, XP011198398.

*Primary Examiner* — Khai Tran
(74) *Attorney, Agent, or Firm* — Womble Bond Dickinson (US) LLP

(57) ABSTRACT

This application provides a signal transmission method and system, and relates to the field of communications technologies. The system includes an equalization module, a first decoder, and a feedback module. The equalization module includes at least two multi-symbol detectors. The feedback module is connected to the first decoder and the at least two multi-symbol detectors. The equalization module performs equalization processing on convolutional data flows to obtain an equalized data flow. In this process, each multi-symbol detector performs multi-symbol detection processing on a convolutional data flow input into the multi-symbol detector. The first decoder decodes the equalized data flow to obtain a decoded data flow. The feedback module feeds back a feedback data flow to the at least two multi-symbol detectors. The equalization module performs equalization processing on the convolutional data flows based on the feedback data flow.

20 Claims, 20 Drawing Sheets

(51) Int. Cl.
*H04B 10/25* (2013.01)
*H04L 1/00* (2006.01)
*H04B 10/61* (2013.01)

(58) Field of Classification Search
USPC .................................. 375/229; 708/322, 323
See application file for complete search history.

(56) References Cited

U.S. PATENT DOCUMENTS

| | | |
|---|---|---|
| 2004/0202231 A1 | 10/2004 | Wang et al. |
| 2009/0177945 A1 | 7/2009 | Djordjevic et al. |
| 2010/0050048 A1 | 2/2010 | Djordjevic et al. |
| 2015/0237407 A1 | 8/2015 | Lee et al. |
| 2015/0318955 A1 | 11/2015 | Wu et al. |
| 2016/0142154 A1 | 5/2016 | Jia et al. |
| 2019/0190841 A1* | 6/2019 | Majmundar ............ H04L 47/38 |

FOREIGN PATENT DOCUMENTS

| | | |
|---|---|---|
| CN | 103384975 A | 11/2013 |
| CN | 105610517 A | 5/2016 |
| WO | 2004040789 A2 | 5/2004 |
| WO | 2006087283 A1 | 8/2006 |

* cited by examiner

SIGNAL TRANSMISSION METHOD AND SYSTEM

CROSS-REFERENCE TO RELATED APPLICATIONS

This application is a continuation of International Application No. PCT/CN2017/097185, filed on Aug. 11, 2017, the disclosure of which is hereby incorporated by reference in its entirety.

TECHNICAL FIELD

This application relates to the field of communications technologies, and in particular, to a signal transmission method and system.

BACKGROUND

As a transmission rate of a high-speed optical fiber transmission system increases, for example, the transmission rate increases from 40 Gb/s (gigabyte per second) to 100 Gb/s, and even to 400 Gb/s, a coherent reception technology is widely applied. A high-speed optical fiber transmission system based on the coherent reception technology may be referred to as a coherent optical transmission system.

At present, the coherent optical transmission system includes: a forward error correction (FEC) encoder, a channel interleaver, a digital-analog converter (DAC), a coherent receiver, an analog-digital converter (ADC), a channel equalizer, a multi-symbol detector, an FEC decoder, and a decision device that are sequentially connected from a transmit end to a receive end. The FEC encoder, the channel interleaver, and the DAC are located at the transmit end. The coherent receiver, the ADC, the channel equalizer, the multi-symbol detector, the FEC decoder, and the decision device are located at the receive end. The DAC is connected to the coherent receiver through an optical fiber. After encoding of the FEC encoder, modulation of the channel interleaver, and digital-analog conversion of the DAC are sequentially performed on a data flow at the transmit end, the data flow is sent to the coherent receiver through the optical fiber. The coherent receiver recovers a baseband signal through the coherent reception technology. The ADC performs analog-digital conversion on the baseband signal. The channel equalizer performs, by using a digital processing algorithm, equalization processing (for example, dispersion compensation, clock recovery, polarization demultiplexing, and carrier phase estimation) on the signal obtained after the analog-digital conversion, and inputs the signal obtained after the equalization processing into the multi-symbol detector. After the multi-symbol detector performs multi-symbol detection processing on the signal obtained after the equalization processing, the FEC decoder decodes the signal obtained after the detection processing. Finally, the decision device decides the decoded signal, to recover the data flow.

In the related art, to implement channel equalization, a plurality of multi-symbol detectors and a plurality of FEC decoders that are in a one-to-one correspondence are usually disposed at a receive end. An input end of each multi-symbol detector is connected to an output end of a channel equalizer. An output end of each multi-symbol detector is connected to an input end of the corresponding FEC decoder. An output end of each FEC decoder is connected to an input end of a decision device and an input end of the corresponding multi-symbol detector. A signal output by the channel equalizer is input into each multi-symbol detector. After the multi-symbol detector performs multi-symbol detection processing on the signal, a plurality of iteration processes are performed. Each iteration process includes: The signal obtained after the detection processing is input into the corresponding FEC decoder for decoding, the FEC decoder feeds back the decoded signal to the corresponding multi-symbol detector, and the multi-symbol detector performs, based on the signal fed back by the FEC decoder, multi-symbol detection on the signal input from the channel equalizer into the multi-symbol detector. In this way, the signal can be iterated between the FEC decoder and the multi-symbol detector.

However, in a coherent optical transmission system in the related art, a plurality of iteration processes need to be performed. Therefore, signal transmission complexity of the coherent optical transmission system is relatively high.

SUMMARY

To resolve a problem of relatively high signal transmission complexity of a coherent optical transmission system in the related art, this application provides a signal transmission method and system. The technical solutions are as follows:

According to a first aspect, a signal transmission system is provided. The signal transmission system includes an equalization module, a first decoder, and a feedback module. The equalization module is connected to the first decoder. The equalization module includes at least two multi-symbol detectors. The feedback module is connected to the first decoder and the at least two multi-symbol detectors.

The equalization module is configured to perform equalization processing on a convolutional data flow to obtain an equalized data flow. In a process in which the equalization module performs equalization processing on the convolutional data flow, each of the at least two multi-symbol detectors is configured to perform multi-symbol detection processing on a convolutional data flow input into the multi-symbol detector.

The first decoder is configured to decode the equalized data flow to obtain a decoded data flow.

The feedback module is configured to determine a feedback data flow based on the decoded data flow, and feed back the feedback data flow to the at least two multi-symbol detectors of the equalization module.

The equalization module is further configured to perform equalization processing on the convolutional data flow based on the feedback data flow. In a process in which the equalization module performs equalization processing on the convolutional data flow, each of the at least two multi-symbol detectors is configured to perform, based on the feedback data flow fed back by the feedback module, multi-symbol detection processing on the convolutional data flow input into the multi-symbol detector.

According to a second aspect, a signal transmission method is provided. The signal transmission method includes:

performing equalization processing on a convolutional data flow to obtain an equalized data flow, where in a process of performing equalization processing on the convolutional data flow, each of at least two multi-symbol detectors is configured to perform multi-symbol detection processing on a convolutional data flow input into the multi-symbol detector;

decoding the equalized data flow to obtain a decoded data flow;

determining a feedback data flow based on the decoded data flow; and performing equalization processing on the convolutional data flow based on the feedback data flow, where in a process of performing equalization processing on the convolutional data flow, each of the at least two multi-symbol detectors is configured to perform, based on the feedback data flow, multi-symbol detection processing on the convolutional data flow input into the multi-symbol detector.

It should be noted that, during actual application, the signal transmission method provided in this application may be implemented by a processor by executing a program. In this case, the encoder, the convolution module, and a DAC may be functional units in a processor of a transmit end device. The processor of the transmit end device may implement, by executing a program, methods corresponding to the encoder, the convolution module, and the DAC in the foregoing method. A coherent receiver, an ADC, the equalization module, the feedback module, the first decoder, the second decoder, and a decision device may be functional units in a processor of a receive end device. The processor of the receive end device may implement, by executing a program, methods corresponding to the coherent receiver, the ADC, the equalization module, the feedback module, the first decoder, the second decoder, and the decision device in the foregoing method.

Beneficial effects of the technical solutions provided in this application are as follows:

According to the signal transmission method and system provided in this application, the equalization module includes the at least two multi-symbol detectors, the at least two multi-symbol detectors perform multi-symbol detection processing on the convolutional data flow based on the feedback data flow, and the feedback data flow is determined based on the decoded data flow. Therefore, a signal may be fed back and transmitted between the first decoder and the at least two multi-symbol detectors without a need to dispose a plurality of decoders and perform a plurality of iteration processes between the decoders and the multi-symbol detectors, so that a problem of relatively high signal transmission complexity is resolved, and signal transmission complexity can be reduced.

DETAILED DESCRIPTION

Figure 1:
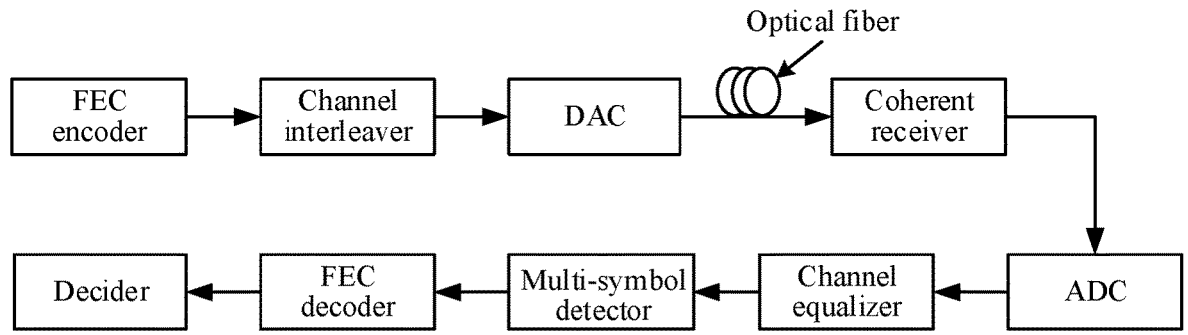
FIG. 1 is a schematic structural diagram of a conventional coherent optical transmission system.

FIG. 1 is a schematic structural diagram of a conventional coherent optical transmission system. Referring to FIG. 1, the coherent optical transmission system includes: an FEC encoder, a channel interleaver, a DAC, a coherent receiver, an ADC, a channel equalizer, a multi-symbol detector, an FEC decoder, and a decision device that are sequentially connected from a transmit end to a receive end. The FEC encoder, the channel interleaver, and the DAC are located at the transmit end. The coherent receiver, the ADC, the channel equalizer, the multi-symbol detector, the FEC decoder, and the decision device are located at the receive end. The DAC is connected to the coherent receiver through an optical fiber. After encoding of the FEC encoder, modulation of the channel interleaver, and digital-analog conversion of the DAC are sequentially performed on a data flow at the transmit end, the data flow is sent to the coherent receiver through the optical fiber. The coherent receiver recovers a baseband signal through a coherent reception technology. The ADC performs analog-digital conversion on the baseband signal. The channel equalizer performs equalization processing on the signal obtained after the analog-digital conversion, and inputs the signal obtained after the equalization processing into the multi-symbol detector. After the multi-symbol detector performs multi-symbol detection processing on the signal obtained after the equalization processing, the FEC decoder decodes the signal obtained after the detection processing. Finally, the decision device decides the decoded signal, to recover the data flow.

Figure 2:
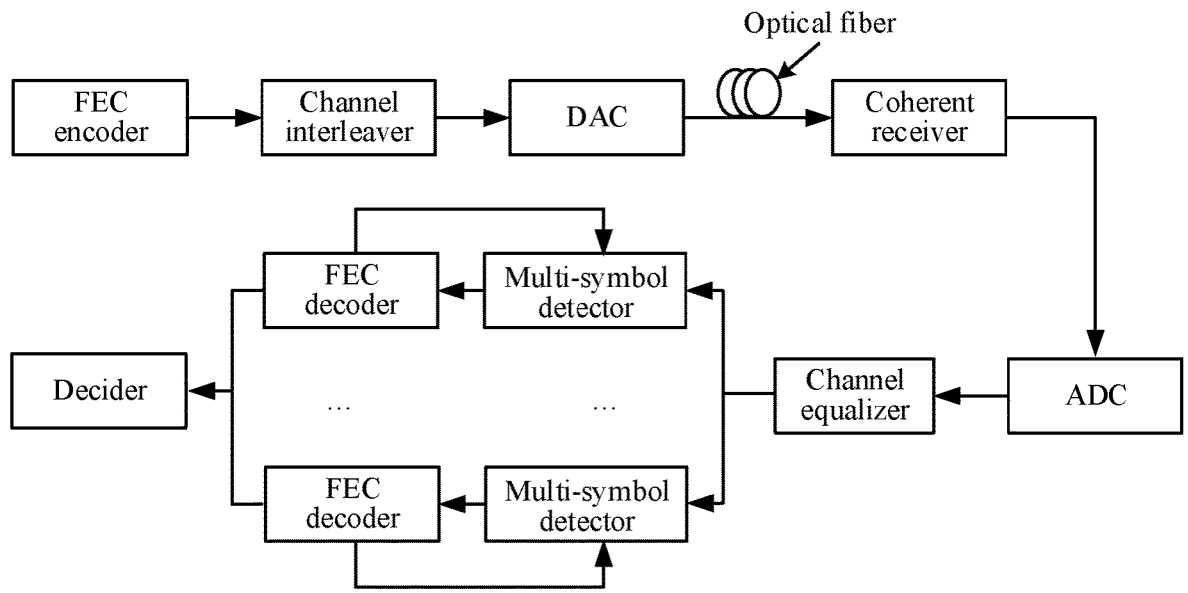
FIG. 2 is a schematic structural diagram of a coherent optical transmission system provided in the related art.

In the related art, to implement channel equalization, as shown in FIG. 2, a plurality of multi-symbol detectors and a plurality of FEC decoders that are in a one-to-one correspondence are usually disposed at a receive end. An input end of each multi-symbol detector is connected to an output end of a channel equalizer. An output end of each multi-symbol detector is connected to an input end of the corresponding FEC decoder. An output end of each FEC decoder is connected to an input end of a decision device and an input end of the corresponding multi-symbol detector. A signal output by the channel equalizer is input into each multi-symbol detector. After the multi-symbol detector performs multi-symbol detection processing on the signal, a plurality of iteration processes are performed. Each iteration process includes: The signal obtained after the detection processing is input into the corresponding FEC decoder for decoding, the FEC decoder feeds back the decoded signal to the corresponding multi-symbol detector, and the multi-symbol detector performs, based on the signal fed back by the FEC decoder, multi-symbol detection on the signal input from the channel equalizer into the multi-symbol detector. In this way, the signal can be iterated between the FEC decoder and the multi-symbol detector. However, in the coherent optical transmission system, a plurality of iteration processes need to be performed. Therefore, signal transmission complexity of the coherent optical transmission system is relatively high. In addition, in the coherent optical transmission system shown in FIG. 2, if there are a relatively small quantity of iterations, precision of data fed back by the FEC decoder to the multi-symbol detector is relatively low, affecting iteration performance. According to a signal transmission system provided in embodiments of this application, data precision can be ensured without a plurality of iterations, and signal transmission complexity can be reduced. For detailed descriptions of a signal transmission method and the signal transmission system that are provided in the embodiments of this application, refer to the following embodiments.

Figure 3:
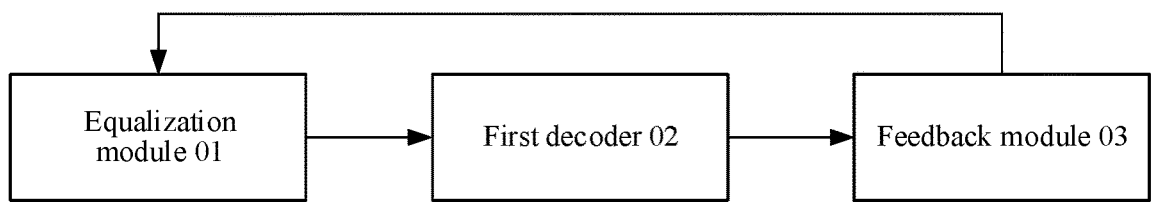
FIG. 3 is a schematic structural diagram of a signal transmission system according to an embodiment of this application.

FIG. 3 is a schematic structural diagram of a signal transmission system according to an embodiment of this application. The signal transmission system may be a coherent optical transmission system. Referring to FIG. 3, the signal transmission system includes an equalization module 01, a first decoder 02, and a feedback module 03. The equalization module 01 is connected to the first decoder 02. The equalization module 01 includes at least two multi-symbol detectors (not shown in FIG. 3). The feedback module 03 is connected to the first decoder 02 and the at least two multi-symbol detectors.

The equalization module 01 is configured to perform equalization processing on a convolutional data flow to obtain an equalized data flow. In a process in which the equalization module 01 performs equalization processing on the convolutional data flow, each of the at least two multi-symbol detectors is configured to perform multi-symbol detection processing on a convolutional data flow input into the multi-symbol detector. The first decoder 02 is configured to decode the equalized data flow to obtain a decoded data flow. The feedback module 03 is configured to determine a feedback data flow based on the decoded data flow, and feed back the feedback data flow to the at least two multi-symbol detectors of the equalization module 01. The equalization module 01 is further configured to perform equalization processing on the convolutional data flow based on the feedback data flow. In a process in which the equalization module 01 performs equalization processing on the convolutional data flow, each of the at least two multi-symbol detectors is configured to perform, based on the feedback data flow fed back by the feedback module 03, multi-symbol detection processing on the convolutional data flow input into the multi-symbol detector.

In conclusion, according to the signal transmission system provided in this embodiment of this application, the equalization module includes the at least two multi-symbol detectors, the at least two multi-symbol detectors perform multi-symbol detection processing on the convolutional data flow based on the feedback data flow, and the feedback data flow is determined based on the decoded data flow. Therefore, a signal may be fed back and transmitted between the first decoder and the at least two multi-symbol detectors without a need to dispose a plurality of decoders and perform a plurality of iteration processes between the decoders and the multi-symbol detectors, so that a problem of relatively high signal transmission complexity is resolved, and signal transmission complexity can be reduced.

Figure 4:
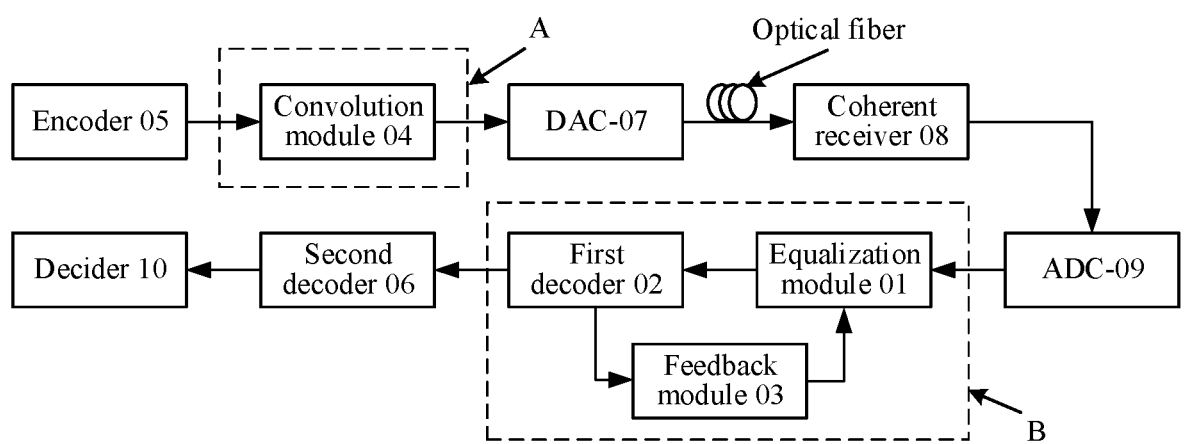
FIG. 4 is a schematic structural diagram of another signal transmission system according to an embodiment of this application.

Further, FIG. 4 is a schematic structural diagram of another signal transmission system according to an embodiment of this application. Based on FIG. 3, the signal transmission system further includes a convolution module 04. The convolution module 04, the equalization module 01, and the first decoder 02 are sequentially connected. The convolution module 04 is configured to perform convolution processing on an encoded data flow input into the convolution module 04, to obtain the convolutional data flow.

Further, the signal transmission system further includes an encoder 05 and a second decoder 06. The encoder 05 is connected to the convolution module 04. The second decoder 06 is connected to the first decoder 02. The encoder 05 is configured to encode a data flow input into the encoder 05, to obtain the encoded data flow. The second decoder 06 is configured to perform second decoding on the decoded data flow.

Further, the signal transmission system further includes a DAC-07, a coherent receiver 08, an ADC-09, and a decision device 10. The encoder 05, the convolution module 04, and the DAC-07 are sequentially connected, and the encoder 05, the convolution module 04, and the DAC-07 are located at a transmit end of the signal transmission system. The coherent receiver 08, the ADC-09, the equalization module 01, the first decoder 02, the second decoder 06, and the decision device 10 are sequentially connected, and the coherent receiver 08, the ADC-09, the equalization module 01, the first decoder 02, the second decoder 06, and the decision device 10 are located at a receive end of the signal transmission system. The DAC-07 is connected to the coherent receiver through an optical fiber. The feedback module 03 is connected to the first decoder 02 and the equalization module 01. For structures and functions of the DAC-07, the coherent receiver 08, the ADC-09, and the decision device 10, refer to the related art. Details are not described in this embodiment of this application.

Optionally, in this embodiment of this application, the encoder 05 may be an FEC encoder, both the first decoder 02 and the second decoder 06 may be FEC decoders, and the decision device 10 may be a soft decision device.

The encoder 05 is configured to encode the data flow input into the encoder 05, to obtain the encoded data flow. The data flow input into the encoder 05 may be a service data flow on a client side. The service data flow may include m service codewords in a one-to-one correspondence with m consecutive time units, the encoder 05 may obtain the encoded data flow after encoding the service data flow, and input the encoded data flow into the convolution module 04, in this embodiment of this application, the encoded data flow includes m encoded codewords in a one-to-one correspondence with the m consecutive units of time, each encoded codeword is obtained by encoding the corresponding service codeword, and each of the m encoded codewords includes k+1 encoded data blocks, where m>1, k>0, and both m and k are integers.

The convolution module 04 is configured to perform convolution processing on the encoded data flow input into the convolution module 04, to obtain the convolutional data flow. The convolutional data flow includes w convolutional codewords in a one-to-one correspondence with w consecutive units of time, where w=m+n*k, each of the w convolutional codewords includes k+1 convolutional data blocks, and each convolutional codeword includes one encoded data block in at least one of the m encoded codewords, where n>0, and n is an integer. After obtaining the convolutional data flow, the convolution module 04 may send the convolutional data flow to the equalization module 01 through the DAC-07, the coherent receiver 08, and the ADC-09 sequentially. In addition, in this process, the DAC-07, the coherent receiver 08, and the ADC-09 may further perform corresponding processing on the convolutional data flow. For a processing process, refer to the related art. Details are not described in this embodiment of this application.

The equalization module 01 is configured to perform equalization processing on the convolutional data flow to obtain the equalized data flow, and input the equalized data flow into the first decoder 02. The equalized data flow includes g equalized codewords in a one-to-one correspondence with g consecutive units of time, where g=m+2n*k. Each of the g equalized codewords includes k+1 equalized data blocks. In the g equalized codewords, m equalized codewords corresponding to the m consecutive units of time are in a one-to-one correspondence with the m encoded codewords. Each of the m equalized codewords includes equalized data blocks obtained after convolution processing and equalization processing are sequentially performed on all the encoded data blocks in the corresponding encoded codeword.

The first decoder 02 is configured to decode the equalized data flow to obtain the decoded data flow, and separately input the decoded data flow into the feedback module 03 and the second decoder 06. The decoded data flow includes g decoded codewords in a one-to-one correspondence with the g consecutive units of time. The g decoded codewords are obtained by decoding the g equalized codewords. Each of the g decoded codewords includes k+1 decoded data blocks.

The feedback module 03 is configured to determine the feedback data flow based on the decoded data flow, and feed back the feedback data flow to the at least two multi-symbol detectors of the equalization module 01. The second decoder 06 is configured to perform second decoding on the decoded data flow, to improve decoding accuracy.

Figure 5:
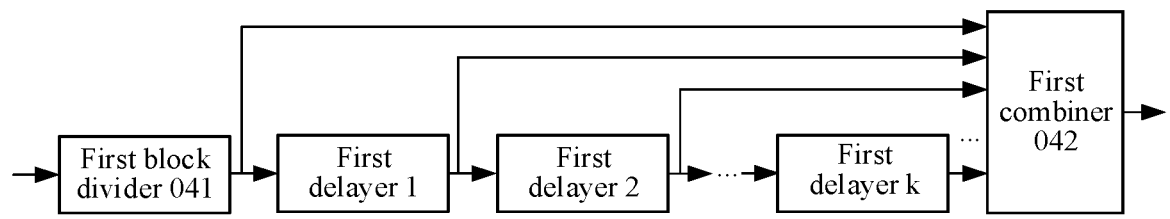
FIG. 5 is a schematic structural diagram of a part of a region of a signal transmission system according to an embodiment of this application.

Optionally, FIG. 5 is a schematic structural diagram of a region A in FIG. 4. With reference to FIG. 4 and FIG. 5, the convolution module 04 includes a first block divider 041, a first combiner 042, and k first delayers. The k first delayers are sequentially connected in series, and the first block divider 041, the k first delayers, and the first combiner 042 are sequentially connected in series. An output end of each of the k first delayers is connected to an input end of the first combiner 042. An input end of the $1^{st}$ first delayer in the k first delayers is connected to the input end of the first combiner 042. Optionally, in FIG. 5, an example in which the k first delayers include a first delayer 1 to a first delayer k is used for description. An output end of the first delayer 1 is connected to an input end of a first delayer 2, and an output end of the first delayer 2 is connected to an input end of a first delayer 3 (not shown in FIG. 5). The rest may be deduced by analogy, until an output end of a first delayer k-1 is connected to an input end of the first delayer k. An output end of the first block divider 041 is connected to an input end of the first delayer 1. The output end of each of the first delayer 1 to the first delayer k is connected to the input end of the first combiner 042. The $1^{st}$ first delayer in the k first delayers may be the first delayer 1. The input end of the first delayer 1 is connected to the input end of the first combiner 042. It should be noted that, during actual application, the first block divider 041 is further connected to the encoder 05.

The encoder 05 is configured to input the encoded data flow into the first block divider 041. The encoded data flow includes the m encoded codewords in a one-to-one correspondence with the m consecutive units of time.

The first block divider 041 is configured to: divide each of the m encoded codewords into the k+1 encoded data blocks, input one of the k+1 encoded data blocks into the first combiner 042, and input k encoded data blocks into the $1^{st}$ first delayer. For example, the first block divider 041 divides each of the m encoded codewords into the k+1 encoded data blocks, inputs one of the k+1 encoded data blocks into the first combiner 042, and inputs the k encoded data blocks into the first delayer 1.

Each of the k first delayers is configured to: delay, by n units of time, p encoded data blocks input into the first delayer, to obtain p delayed encoded data blocks, input one of the p delayed encoded data blocks into the first combiner, and input p−1 delayed encoded data blocks into a next first delayer connected to the first delayer, where 1≤p≤k, and p is an integer. For example, the first delayer 1 delays, by n time units, p (p=k) encoded data blocks input into the first delayer 1, to obtain p delayed encoded data blocks, inputs one of the p delayed encoded data blocks into the first combiner 042, and inputs p−1 (p−1=k−1) delayed encoded data blocks into the first delayer 2. The first delayer 2 delays, by n units of time, p (p=k−1) encoded data blocks input into the first delayer 2, to obtain p delayed encoded data blocks, inputs one of the p delayed encoded data blocks into the first combiner 042, and inputs p−1 (p−1=k−2) delayed encoded data blocks into the first delayer 3. The rest may be deduced by analogy, until the first delayer k−1 inputs p−1 (p−1=1) delayed encoded data blocks into the first delayer k.

The first combiner 042 is configured to combine encoded data blocks that correspond to the m encoded codewords and that are input into the first combiner 042, to obtain the convolutional data flow. The encoded data blocks combined by the first combiner 042 may include the encoded data block that is input into the first combiner 042 by the first delayer 1 and on which no delay processing is performed and the delayed encoded data block that is input into the first combiner 042 by each of the first delayer 2 to the first delayer k and on which delay processing is performed.

Optionally, in this embodiment of this application, the first block divider 041 is specifically configured to: divide each of the m encoded codewords into the k+1 encoded data blocks that are sequentially arranged, input the first encoded data block in the k+1 encoded data blocks into the first combiner, and input the second encoded data block to a $(k+1)^{th}$ encoded data block into the $1^{st}$ first delayer 1. Each of the k first delayers is specifically configured to: delay, by n units of time, the p encoded data blocks input into the first delayer that are sequentially arranged, to obtain the p delayed encoded data blocks, input the first delayed encoded data block in the p delayed encoded data blocks into the first combiner, and input the second delayed encoded data block to a $p^{th}$ delayed encoded data block into the next first delayer connected to the first delayer.

The first combiner 042 is configured to combine, in chronological order, the encoded data blocks that correspond to the m encoded codewords and that are input into the first combiner 042, to obtain the convolutional data flow. The convolutional data flow includes the w convolutional codewords. In the w convolutional codewords:
n*k convolutional codewords corresponding to the first n*k units of time in the w units of time include k convolutional codeword groups, each convolutional codeword group includes n convolutional codewords, and each convolutional codeword includes i first convolutional data blocks and k+1−i second convolutional data blocks, where each of the i first convolutional data blocks is an encoded data block in i of n*i encoded codewords corresponding to the first n*i units of time in the m units of time, the i first convolutional data blocks are from the i encoded codewords in a one-to-one correspondence manner, and the k+1−i second convolutional data blocks are initial data blocks, where $k \geq i > 0$, and i is an integer. In this embodiment of this application, in the n*k convolutional codewords corresponding to the first n*k units of time, numbers of the convolutional codeword groups may be sorted in chronological order, i represents a number of a convolutional codeword group, and data in the initial data blocks is 0;

n*k convolutional codewords corresponding to the last n*k units of time in the w units of time include k convolutional codeword groups, each convolutional codeword group includes n convolutional codewords, and each convolutional codeword includes k+1−j first convolutional data blocks and j second convolutional data blocks, where each of the k+1−j first convolutional data blocks is an encoded data block in k+1−j of n*j encoded codewords corresponding to the last n*j units of time in the m units of time, the k+1−j first convolutional data blocks are from the k+1−j encoded codewords in a one-to-one correspondence manner, and the j second encoded data blocks are the initial data blocks, where $k \geq j > 0$, and j is an integer. In this embodiment of this application, in the n*k convolutional codewords corresponding to the last n*k units of time, numbers of the convolutional codeword groups may be sorted in chronological order, j represents a number of a convolutional codeword group, and data in the initial data blocks is 0; and A convolutional codeword corresponding to each of at least one intermediate unit of time includes k+1 first convolutional data blocks. Each of the k+1 first convolutional data blocks is an encoded data block in k+1 of the m encoded codewords. The k+1 first convolutional data blocks are from the k+1 encoded codewords in a one-to-one correspondence manner. The intermediate unit of time is a unit of time other than the first n*k units of time and the last n*k units of time in the w units of time.

Figure 6A:
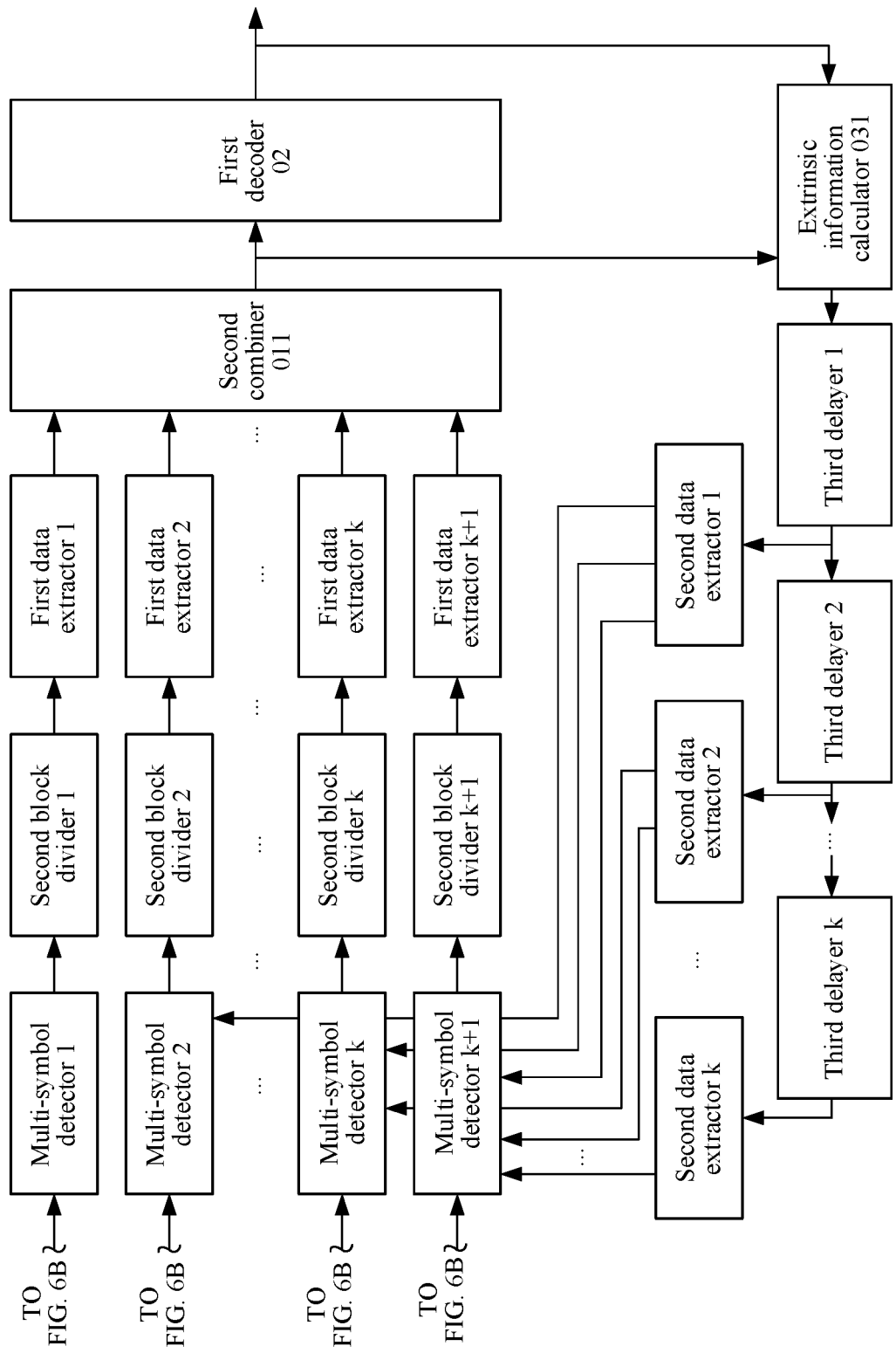
FIG. 6A and FIG. 6B are schematic structural diagrams of another part of a region of a signal transmission system according to an embodiment of this application.
Figure 6B:
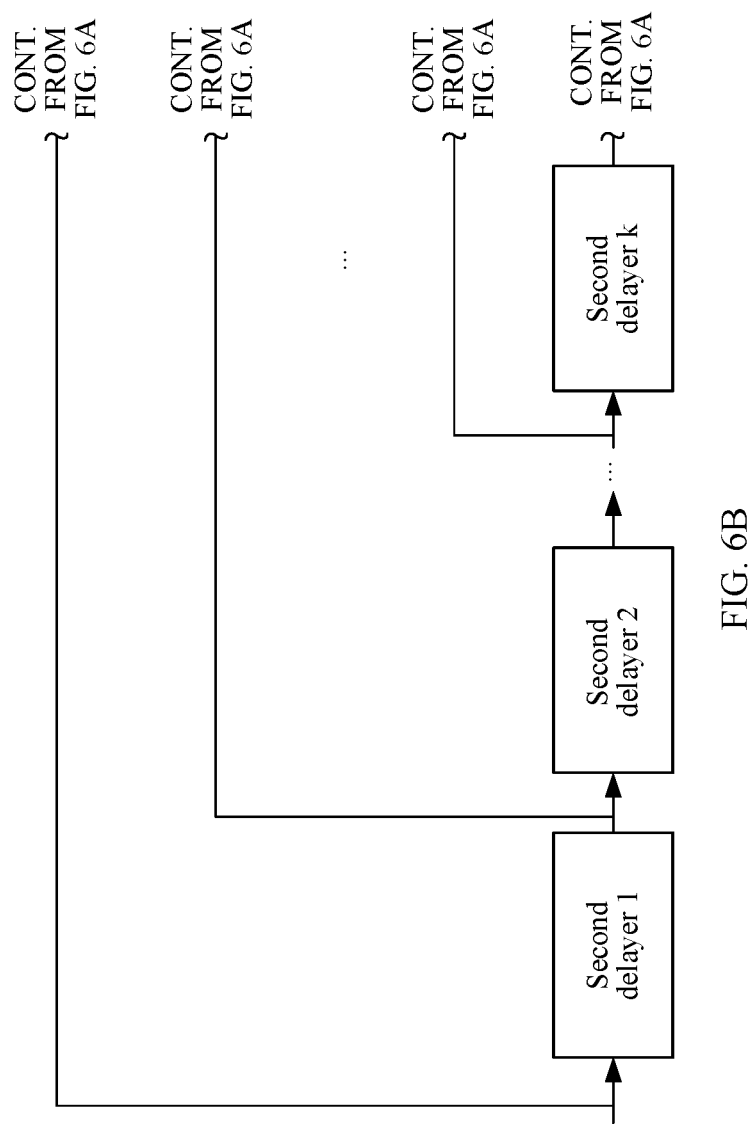

Optionally, FIG. 6A and FIG. 6B are a schematic structural diagram of a region B in FIG. 4. The region B includes the equalization module 01, the first decoder 02, and the feedback module 03. With reference to FIG. 4, FIG. 6A, and FIG. 6B, the equalization module 01 includes: a second combiner 011, k second delayers, k+1 multi-symbol detectors, k+1 second block dividers, and k+1 first data extractors. Output ends of the k+1 multi-symbol detectors are connected to input ends of the k+1 second block dividers in a one-to-one correspondence manner. Output ends of the k+1 second block dividers are connected to input ends of the k+1 first data extractors in a one-to-one correspondence. An output end of each of the k+1 first data extractors is connected to an input end of the second combiner 011. The k second delayers are sequentially connected in series, and output ends of the k second delayers are connected to input ends of k of the k+1 multi-symbol detectors in a one-to-one correspondence manner. An input end of the $1^{st}$ second delayer in the k second delayers is connected to an input end of a multi-symbol detector other than the k multi-symbol detectors in the k+1 multi-symbol detectors. The input end of the $1^{st}$ second delayer is further connected to the convolution module 04, and the input end of the $1^{st}$ second delayer is connected to the convolution module 04 specifically by using the coherent receiver 08 and the DAC-07. For example, in FIG. 6A and FIG. 6B, an example in which the k second delayers include a second delayer 1 to a second delayer k, the k+1 multi-symbol detectors include a multi-symbol detector 1 to a multi-symbol detector k+1, the k+1 second block dividers include a second block divider 1 to a second block divider k+1, and the k+1 first data extractors include a first data extractor 1 to a first data extractor k+1 is used as an example for description. An output end of the multi-symbol detector 1 is connected to an input end of the second block divider 1, and an output end of a multi-symbol detector 2 is connected to an input end of a second block divider 2. By analogy, an output end of a multi-symbol detector k is connected to an input end of a second block divider k, and an output end of the multi-symbol detector k+1 is connected to an input end of the second block divider k+1. An output end of the second block divider 1 is connected to an input end of the first data extractor 1, and an output end of the second block divider 2 is connected to an input end of a first data extractor 2. By analogy, an output end of the second block divider k is connected to an input end of a first data extractor k, and an output end of the second block divider k+1 is connected to an input end of the first data extractor k+1. An output end of the second delayer 1 is connected to an input end of the multi-symbol detector 2, an output end of a second delayer 2 is connected to an input end of a multi-symbol detector 3 (not shown in FIG. 6A and FIG. 6B), and by analogy, an output end of the second delayer k is connected to an input end of the multi-symbol detector k+1. The $1^{st}$ delayer in the k second delayers may be the second delayer 1. An input end of the second delayer 1 is connected to an input end of the multi-symbol detector 1. In addition, the input end of the second delayer 1 is further connected to the convolution module 04, and the input end of the second delayer 1 is connected to the convolution module 04 specifically by using the coherent receiver 08 and the DAC-07.

The convolution module 04 is configured to separately input the convolutional data flow into the $1^{st}$ second delayer and the multi-symbol detector connected to the input end of the $1^{st}$ second delayer. For example, the convolution module 04 separately inputs the convolutional data flows into the second delayer 1 and the multi-symbol detector 1.

Each of the k second delayers is configured to: delay, by n units of time, a convolutional data flow input into the second delayer, to obtain a delayed convolutional data flow, and separately input the delayed convolutional data flow into a multi-symbol detector and a next second delayer that are connected to the second delayer. Each delayed convolutional data flow includes w delayed convolutional codewords in a one-to-one correspondence with the w consecutive units of time. For example, the second delayer 1 delays, by n units of time, the convolutional data flow input into the second delayer 1, to obtain a delayed convolutional data flow, and separately inputs the delayed convolutional data flow into the multi-symbol detector 2 and the second delayer 2. The second delayer 2 delays, by n units of time, the convolutional data flow input into the second delayer 2, to obtain a delayed convolutional data flow, and inputs the delayed convolutional data flow into the multi-symbol detector 3 and a second delayer 3. The rest may be deduced by analogy, until the second delayer k−1 delays, by n units of time, a convolutional data flow input into the second delayer k−1, to obtain a delayed convolutional data flow, and separately inputs the delayed convolutional data flow into the multi-symbol detector k and the second delayer k.

Each of the k+1 multi-symbol detectors is configured to perform multi-symbol detection processing on a convolutional data flow input into the multi-symbol detector, to obtain a multi-symbol detected convolutional data flow, and input the multi-symbol detected convolutional data flow into a second block divider connected to the multi-symbol detector. Each multi-symbol detected convolutional data flow includes w multi-symbol detected convolutional codewords in a one-to-one correspondence with the w consecutive units of time. For example, the multi-symbol detector 1 performs multi-symbol detection processing on the convolutional data flow input into the multi-symbol detector 1, to obtain a multi-symbol detected convolutional data flow, and inputs the multi-symbol detected convolutional data flow into the second block divider 1. The multi-symbol detector 2 performs multi-symbol detection processing on the convolutional data flow input into the multi-symbol detector 2, to obtain a multi-symbol detected convolutional data flow, and inputs the multi-symbol detected convolutional data flow into the second block divider 2. The rest may be deduced by analogy, until the multi-symbol detector k+1 performs multi-symbol detection processing on a convolutional data flow input into the multi-symbol detector k+1, to obtain a multi-symbol detected convolutional data flow, and inputs the multi-symbol detected convolutional data flow into the second block divider k+1.

Each of the k+1 second block dividers is configured to divide each multi-symbol convolutional codeword in the multi-symbol detected convolutional data flow input into the second block divider into k+1 convolutional data blocks, to obtain k+1 convolutional data block flows, and input the k+1 convolutional data block flows into a first data extractor connected to the second block divider. For example, the second block divider 1 divides each multi-symbol convolutional codeword in the multi-symbol detected convolutional data flow input into the second block divider 1 into k+1 convolutional data blocks, to obtain k+1 convolutional data block flows, and inputs the k+1 convolutional data block flows into the first data extractor 1. The second block divider 2 divides each multi-symbol convolutional codeword in the convolutional data flow input into the second block divider 2 into k+1 convolutional data blocks, to obtain k+1 convolutional data block flows, and inputs the k+1 convolutional data block flows into the first data extractor 2. The rest may be deduced by analogy, until the second block divider k+1 divides each multi-symbol convolutional codeword in the multi-symbol detected convolutional data flow input into the second block divider k+1 into k+1 convolutional data blocks, to obtain k+1 convolutional data block flows, and inputs the k+1 convolutional data block flows into the first data extractor k+1.

Each of the k+1 first data extractors is configured to extract a target convolutional data block flow from the k+1 convolutional data block flows input into the first data extractor, and input the extracted target convolutional data block flow into the second combiner. For example, the first data extractor 1 extracts a target convolutional data block flow from the k+1 convolutional data block flows input into the first data extractor 1, and inputs the target convolutional data block flow into the second combiner 011. The first data extractor 2 extracts a target convolutional data block flow from the k+1 convolutional data block flows input into the first data extractor 2, and inputs the target convolutional data block flow into the second combiner 011. The rest may be deduced by analogy, until the first data extractor k+1 extracts a target convolutional data block flow from the k+1 convolutional data block flows input into the first data extractor k+1, and inputs the target convolutional data block flow into the second combiner 011. In this case, there are a total of k+1 target convolutional data block flows input into the second combiner 011.

The second combiner 011 is configured to combine the k+1 target convolutional data block flows input into the second combiner 011, to obtain the equalized data flow. Specifically, the second combiner 011 combines the target convolutional data block flows input by all of the first data extractor 1 to the first data extractor k+1.

Optionally, in this embodiment of this application, the second combiner 011 is configured to combine, in chronological order, the k+1 target convolutional data block flows input into the second combiner 011, to obtain the equalized data flow. The equalized data flow includes the k+1 target convolutional data block flows. Each target convolutional data block flow includes one equalized data block in each of the g equalized codewords. In the g equalized codewords: an equalized codeword corresponding to each of the first n*k units of time and the last n*k units of time in the g units of time includes k+1 initial data blocks, and data in the initial data blocks is 0. An equalized codeword corresponding to each of at least one intermediate unit of time in the g units of time includes: equalized data blocks obtained after convolution processing and equalization processing are sequentially performed on k+1 encoded data blocks in a corresponding encoded codeword. The intermediate unit of time is a unit of time other than the first n*k units of time and the last n*k units of time in the g units of time.

Further, still referring to FIG. 4, FIG. 6A, and FIG. 6B, the feedback module 03 includes k third delayers. The k third delayers are sequentially connected in series. An output end of the first decoder 02 is connected to an input end of the $1^{st}$ third delayer in the k third delayers. An output end of a $q^{th}$ third delayer in the k third delayers is connected to input ends of k+1−q of the k+1 multi-symbol detectors. The k+1−q multi-symbol detectors are multi-symbol detectors connected to output ends of the last k+1−q second delayers in the k second delayers. For example, in FIG. 6A and FIG. 6B, an example in which the k third delayers include a third delayer 1 to a third delayer k is used for description. An output end of the third delayer 1 is connected to an input end of a third delayer 2, and an output end of the third delayer 2 is connected to an input end of a third delayer 3 (not shown in FIG. 6A and FIG. 6B). The rest may be deduced by analogy, until an output end of a third delayer k−1 is connected to an input end of the third delayer k. The $1^{st}$ third delayer in the k third delayers is the third delayer 1. The output end of the first decoder 02 is connected to an input end of the third delayer 1. The output end of the $1^{st}$ third delayer (the third delayer 1) in the k third delayers is connected to input ends of k multi-symbol detectors such as the multi-symbol detector k+1, the multi-symbol detector k, and a multi-symbol detector k−1 (not shown in FIG. 6A and FIG. 6B) in the k+1 multi-symbol detectors. The output end of the $2^{nd}$ third delayer (the third delayer 2) in the k third delayers is connected to input ends of k−1 multi-symbol detectors such as the multi-symbol detector k+1, the multi-symbol detector k, and the multi-symbol detector k−1 (not shown in FIG. 6A and FIG. 6B) in the k+1 multi-symbol detectors. The rest may be deduced by analogy.

Each of the k third delayers is configured to: delay, by n units of time, a decoded data flow input into the third delayer, to obtain a delayed decoded data flow, and input the delayed decoded data flow into a multi-symbol detector and a next third delayer that are connected to the third delayer. For example, the third delayer 1 delays, by n units of time, a decoded data flow input into the third delayer 1, to obtain a delayed decoded data flow, and inputs the delayed decoded data flows into k multi-symbol detectors such as the multi-symbol detector k+1, the multi-symbol detector k, and the multi-symbol detector k−1 (not shown in FIG. 6A and FIG. 6B) and a next third delayer. The third delayer 2 delays, by n units of time, a decoded data flow input into the third delayer 2, to obtain a delayed decoded data flow, and inputs the delayed decoded data flow into k−1 multi-symbol detectors such as the multi-symbol detector k+1, the multi-symbol detector k, and the multi-symbol detector k−1 (not shown in FIG. 6A and FIG. 6B) and a next third delayer. The rest may be deduced by analogy.

Each of the k+1 multi-symbol detectors is configured to perform, based on a delayed decoded data flow fed back by a third delayer connected to the multi-symbol detector, multi-symbol detection processing on the convolutional data flow input into the multi-symbol detector. The convolutional data flow herein includes a convolutional data flow on which no delay processing is performed and a delayed convolutional data flow on which delay processing is performed. For example, the multi-symbol detector 2 performs, based on the delayed decoded data flow fed back by the third delayer 1, multi-symbol detection processing on the convolutional data flow input into the multi-symbol detector 2, the multi-symbol detector 3 performs, based on the delayed decoded data flow fed back by the third delayer 1 and the delayed decoded data flow fed back by the third delayer 2, multi-symbol detection processing on a convolutional data flow input into the multi-symbol detector 3. The rest may be deduced by analogy.

Optionally, in this embodiment of this application, the decoded data flow includes k+1 decoded data block flows. The k+1 decoded data block flows are obtained by decoding the k+1 target convolutional data block flows in the equalized data flow by the first decoder 02. With reference to FIG. 4, FIG. 6A, and FIG. 6B, the feedback module 03 further includes an extrinsic information calculator 031 and k second data extractors. An input end of the extrinsic information calculator 031 is connected to the output end of the first decoder 02 and an input end of the first decoder 02. An output end of the extrinsic information calculator 031 is connected to the 1$^{st}$ third delayer in the k third delayers. Each of the k third delayers is connected to an input end of a corresponding multi-symbol detector by using one second data extractor. For example, in FIG. 6A and FIG. 6B, an example in which the k second data extractors include a second data extractor 1 to a second data extractor k is used for description. The output end of the extrinsic information calculator 031 is connected to the input end of the third delayer 1. The third delayer 1 is connected to the input ends of the k multi-symbol detectors such as the multi-symbol detector k+1, the multi-symbol detector k, and the multi-symbol detector k−1 by using the second data extractor 1. The third delayer 2 is connected to the input ends of the k−1 multi-symbol detectors such as the multi-symbol detector k+1, the multi-symbol detector k, and the multi-symbol detector k−1 by using a second data extractor 2. The rest may be deduced by analogy.

The extrinsic information calculator 031 is configured to calculate an extrinsic information flow of the first decoder 02 based on the decoded data flow output by the first decoder 02 and the equalized data flow input into the first decoder 02. The extrinsic information flow includes k+1 extrinsic information block flows. The k+1 extrinsic information block flows are calculated by the extrinsic information calculator based on the k+1 decoded data block flows and the k+1 target convolutional data block flows.

Each of the k third delayers is configured to: delay, by n units of time, an extrinsic information flow input into the third delayer, to obtain a delayed extrinsic information flow, and input the delayed extrinsic information flow into a second data extractor and a next third delayer that are connected to the third delayer. Each delayed extrinsic information flow includes k+1 delayed extrinsic information block flows. For example, the third delayer 1 delays, by n units of time, an extrinsic information flow input into the third delayer 1, to obtain a delayed extrinsic information flow, and inputs the delayed extrinsic information flow into the second data extractor 1 and the third delayer 2. The third delayer 2 delays, by n units of time, an extrinsic information flow input into the third delayer 2, to obtain a delayed extrinsic information flow, and inputs the delayed extrinsic information flow into the second data extractor 2 and the third delayer 3. The rest may be deduced by analogy, until the third delayer k−1 delays, by n units of time, an extrinsic information flow input into the third delayer k−1, to obtain a delayed extrinsic information flow, and inputs the delayed extrinsic information flow into the second data extractor k−1 and the third delayer k.

Each of the k second data extractors is configured to extract a target delayed extrinsic information block flow from k+1 delayed extrinsic information block flows of a delayed extrinsic information flow input into the second data extractor, and input the extracted target delayed extrinsic information block flow into a multi-symbol detector connected to the second data extractor. For example, the second data extractor 1 extracts a target delayed extrinsic information block flow from k+1 delayed extrinsic information block flows of the delayed extrinsic information flow input into the second data extractor 1, and inputs the target delayed extrinsic information block flow into the k multi-symbol detectors such as the multi-symbol detector k+1, the multi-symbol detector k, and the multi-symbol detector k−1. The second data extractor 2 extracts a target delayed extrinsic information block flow from k+1 delayed extrinsic information block flows of the delayed extrinsic information flow input into the second data extractor 2, and input the target delayed extrinsic information block flow into the k−1 multi-symbol detectors such as the multi-symbol detector k+1, the multi-symbol detector k, and the multi-symbol detector k−1. The rest may be deduced by analogy.

Each of the k+1 multi-symbol detectors is configured to perform, based on the target delayed extrinsic information block flow fed back by the second data extractor connected to the multi-symbol detector, multi-symbol detection processing on the convolutional data flow input into the multi-symbol detector. The convolutional data flow herein includes the convolutional data flow on which no delay processing is performed and the delayed convolutional data flow on which delay processing is performed. For example, the multi-symbol detector 2 performs, based on a target delayed extrinsic information block flow fed back by the third delayer 1, multi-symbol detection processing on the convolutional data flow input into the multi-symbol detector 2. The multi-symbol detector 3 performs, based on the target delayed extrinsic information block flow fed back by the third delayer 1 and the target delayed extrinsic information block flow fed back by the third delayer 2, multi-symbol detection processing on the convolutional data flow input into the multi-symbol detector 3. The rest may be deduced by analogy.

In this embodiment of this application, values of m, n, and k may be set based on an actual case. The following describes, by using an example in which m=4, n=1, and k=3, the signal transmission system provided in this embodiment of this application. A schematic diagram of a process of processing a data flow in the region A in FIG. 4 may be shown in FIG. 7A and FIG. 7B, and schematic diagrams of a process of processing a data flow in the region B in FIG. 4 may be shown in FIG. 8A to FIG. 10E.

Figure 7A:
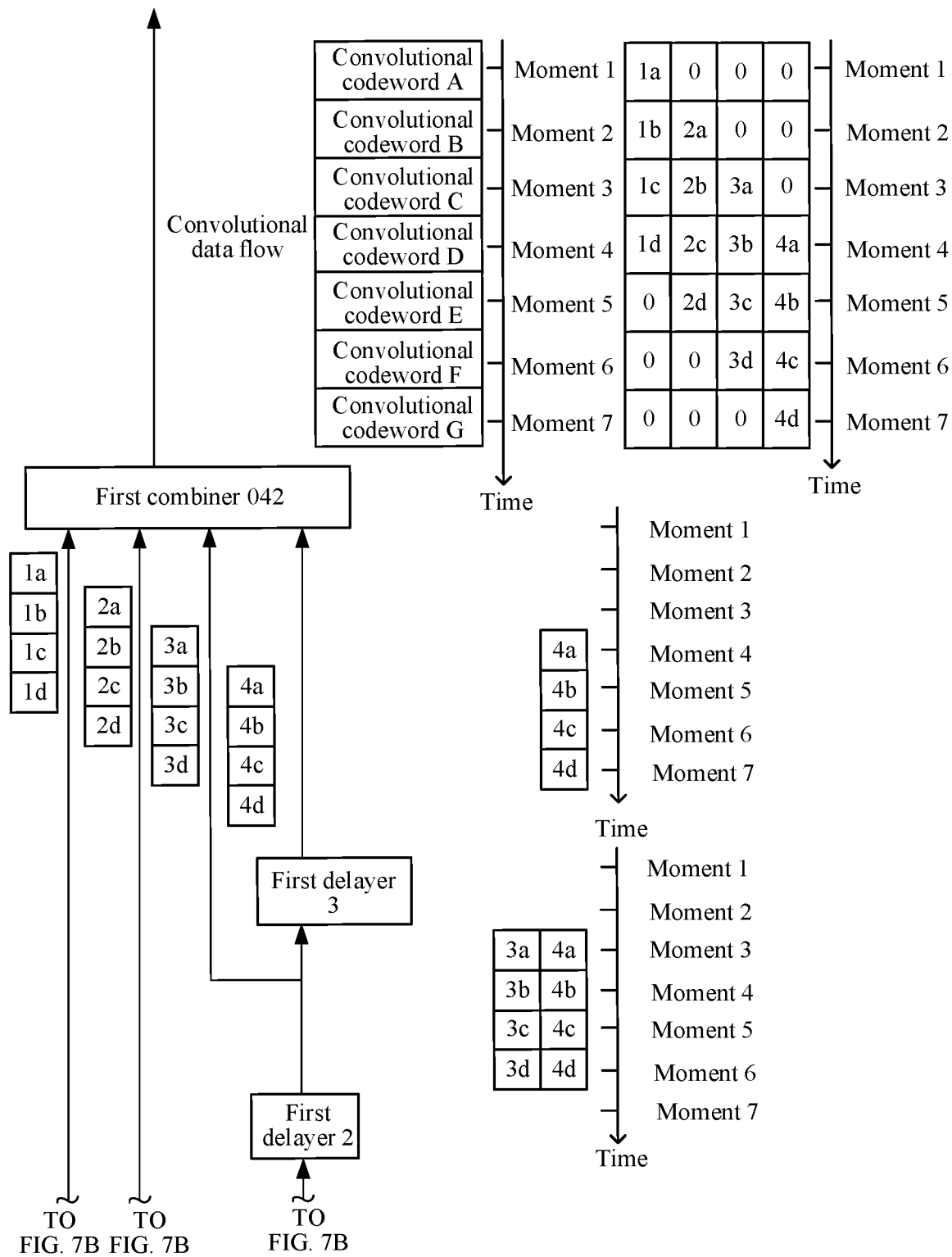
FIG. 7A and FIG. 7B are schematic diagrams of a process in which a signal transmission system processes a data flow according to an embodiment of this application.
Figure 7B:
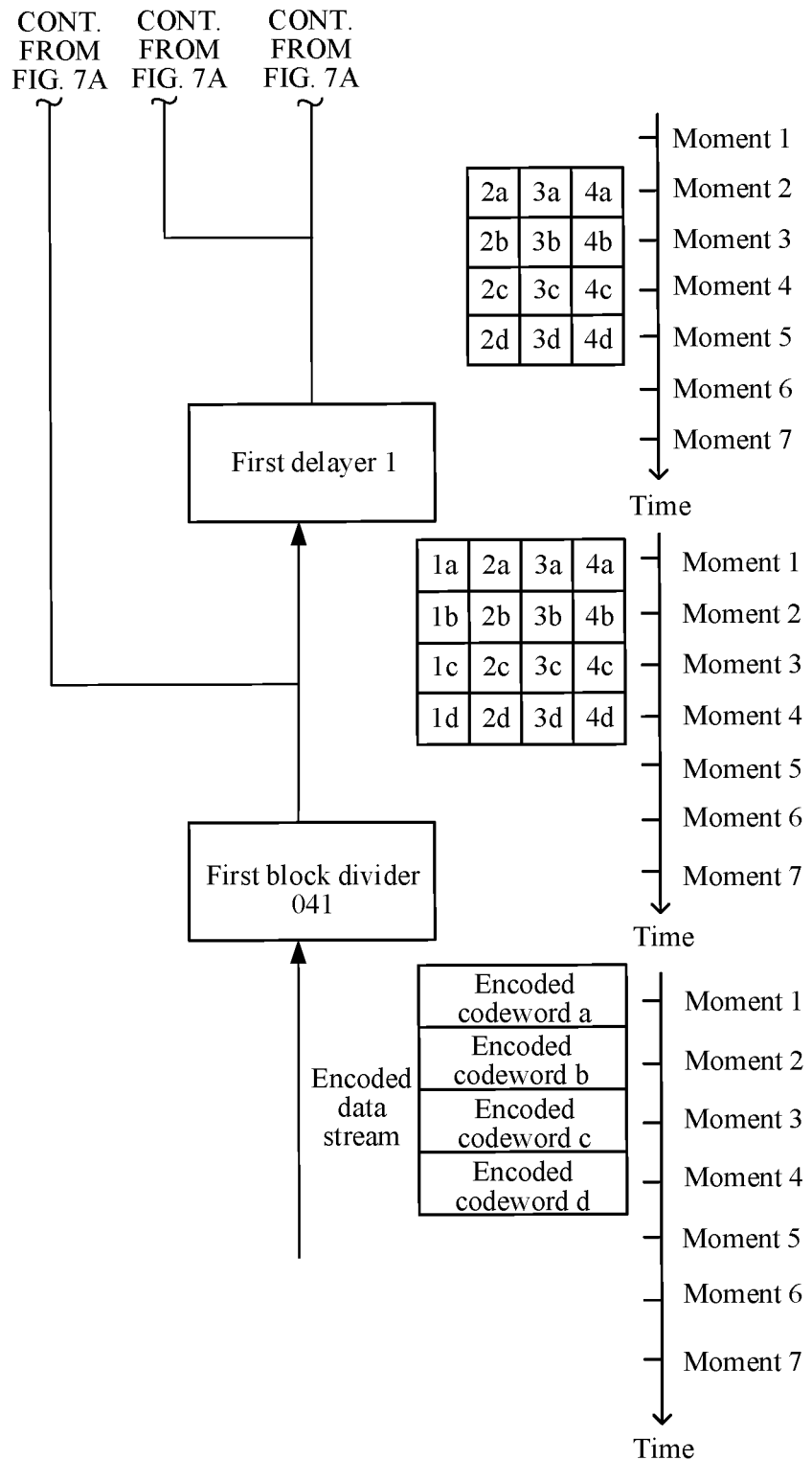

With reference to FIG. 4, FIG. 7A, and FIG. 7B, the convolution module 04 includes a first block divider 041, a first combiner 042, and three first delayers. The three first delayers are a first delayer 1, a first delayer 2, and a first delayer 3. An output end of the first delayer 1 is connected to an input end of the first delayer 2. An output end of the first delayer 2 is connected to an input end of the first delayer 3. The first block divider 041, the three first delayers, and the first combiner 042 are sequentially connected in series, the output end of the first delayer 1, the output end of the first delayer 2, and an output end of the first delayer 3 are separately connected to an input end of the first combiner 042, and an input end of the first delayer 1 is connected to the input end of the first combiner 042. An input end of the first block divider 041 is further connected to the encoder 05.

With reference to FIG. 4, FIG. 7A, and FIG. 7B, the encoder 05 encodes the data flow input into the encoder 05 to obtain the encoded data flow, and inputs the encoded data flow into the first block divider 041. The encoded data flow includes four encoded codewords in a one-to-one correspondence with four consecutive units of time. The four encoded codewords include an encoded codeword a corresponding to a moment 1, an encoded codeword b corresponding to a moment 2, an encoded codeword c corresponding to a moment 3, and an encoded codeword d corresponding to a moment 4. Each moment may be one unit of time.

The first block divider 041 may divide each of the four encoded codewords in the encoded data flow into four encoded data blocks, input one of the four encoded data blocks into the first combiner 042, and input three encoded data blocks into the first delayer 1. Specifically, the first block divider 041 divides each of the four encoded codewords into the four encoded data blocks that are sequentially arranged, inputs the first encoded data block in the four encoded data blocks into the first combiner, and inputs the second encoded data block to the fourth encoded data block into the first delayer 1. As shown in FIG. 7A and FIG. 7B, the first block divider 041 divides the encoded codeword a into an encoded data block 1a, an encoded data block 2a, an encoded data block 3a, and an encoded data block 4a that are sequentially arranged, inputs the encoded data block 1a (the first encoded data block) into the first combiner 042, and inputs the encoded data block 2a, the encoded data block 3a, and the encoded data block 4a (the second encoded data block to the fourth encoded data block) into the first delayer 1. The first block divider 041 divides the encoded codeword b into an encoded data block 1b, an encoded data blocks 2b, an encoded data block 3b, and an encoded data block 4b that are sequentially arranged, inputs the encoded data block 1b (the first encoded data block) into the first combiner 042, and inputs the encoded data block 2b, the encoded data block 3b, and the encoded data block 4b (the second encoded data block to the fourth encoded data block) into the first delayer 1. The first block divider 041 divides the encoded codeword c into an encoded data block 1c, an encoded data block 2c, an encoded data block 3c, and an encoded data block 4c that are sequentially arranged, inputs the encoded data block 1c (the first encoded data block) into the first combiner 042, and inputs the encoded data block 2c, the encoded data block 3c, and the encoded data block 4c (the second encoded data block to the fourth encoded data block) into the first delayer 1. The first block divider 041 divides the encoded codeword d into an encoded data block 1d, an encoded data block 2d, an encoded data block 3d, and an encoded data block 4d that are sequentially arranged, inputs the encoded data block 1d (the first encoded data block) into the first combiner 042, and inputs the encoded data block 2d, the encoded data block 3d, and the encoded data block 4d (the second encoded data block to the fourth encoded data block) into the first delayer 1.

Each of the three first delayers delays, by one unit of time (namely, one moment), p encoded data blocks input into the first delayer, to obtain p delayed encoded data blocks, inputs one of the p delayed encoded data blocks into the first combiner 042, and inputs p−1 delayed encoded data blocks into a next first delayer connected to the first delayer, where $1 \leq p \leq 3$, and p is an integer. Specifically, the p encoded data blocks are sequentially arranged. Each of the three first delayers delays, by one unit of time, the p encoded data blocks input into the first delayer that are sequentially arranged, to obtain the p delayed encoded data blocks, inputs the first delayed encoded data block in the p delayed encoded data blocks into the first combiner 042, and inputs the second delayed encoded data block to a $p^{th}$ delayed encoded data block into the next first delayer connected to the first delayer. For example, as shown in FIG. 7A and FIG. 7B, the first delayer 1 delays, by one unit of time, the encoded data block 2a, the encoded data block 3a, and the encoded data block 4a (three encoded data blocks) that are input into the first delayer 1 and that are sequentially arranged, to obtain a delayed encoded data block 2a, a delayed encoded data block 3a, and a delayed encoded data block 4a that are sequentially arranged, inputs the delayed encoded data block 2a (the first delayed encoded data block) into the first combiner 042, and inputs the delayed encoded data block 3a and the delayed encoded data block 4a (the second delayed encoded data block and the third delayed encoded data block) into the first delayer 2. The first delayer 1 delays, by one unit of time, the encoded data block 2b, the encoded data block 3b, and the encoded data block 4b (three encoded data blocks) that are input into the first delayer 1 and that are sequentially arranged, to obtain a delayed encoded data block 2b, a delayed encoded data block 3b, and a delayed encoded data block 4b that are sequentially arranged, inputs the delayed encoded data block 2b (the first delayed encoded data block) into the first combiner 042, and inputs the delayed encoded data block 3b and the delayed encoded data block 4b (the second delayed encoded data block and the third delayed encoded data block) into the first delayer 2. The first delayer 1 delays, by one unit of time, the encoded data block 2c, the encoded data block 3c, and the encoded data block 4c (three encoded data blocks) that are input into the first delayer 1 and that are sequentially arranged, to obtain a delayed encoded data block 2c, a delayed encoded data block 3c, and a delayed encoded data block 4c that are sequentially arranged, inputs the delayed encoded data block 2c (the first delayed encoded data block) into the first combiner 042, and inputs the delayed encoded data block 3c and the delayed encoded data block 4c (the second delayed encoded data block and the third delayed encoded data block) into the first delayer 2. The first delayer 1 delays, by one unit of time, the encoded data block 2d, the encoded data block 3d, and the encoded data block 4d (three encoded data blocks) that are input into the first delayer 1 and that are sequentially arranged, to obtain a delayed encoded data block 2d, a delayed encoded data block 3d, and a delayed encoded data block 4d that are sequentially arranged, inputs the delayed encoded data block 2d (the first delayed encoded data block) into the first combiner 042, and inputs the delayed encoded data block 3d and the delayed encoded data block 4d (the second delayed encoded data block and the third delayed encoded data block) into the first delayer 2. The first delayer 2 delays, by one unit of time, the encoded data block 3a and the encoded data block 4a (two encoded data blocks, where the two encoded data blocks are the delayed encoded data blocks delayed by the first delayer 1) that are input into the first delayer 2 and that are sequentially arranged, to obtain a delayed encoded data block 3a and a delayed encoded data block 4a that are sequentially arranged, inputs the delayed encoded data block 3a (the first delayed encoded data block) into the first combiner 042, and inputs the delayed encoded data block 4a (the second delayed encoded data block) into the first delayer 3. The first delayer 2 delays, by one unit of time, the encoded data block 3b and the encoded data block 4b (two encoded data blocks, where the two encoded data blocks are the delayed encoded data blocks delayed by the first delayer 1) that are input into the first delayer 2 and that are sequentially arranged, to obtain a delayed encoded data block 3b and a delayed encoded data block 4b that are sequentially arranged, inputs the delayed encoded data block 3b (the first delayed encoded data block) into the first combiner 042, and inputs the delayed encoded data block 4b (the second delayed encoded data block) into the first delayer 3. The first delayer 2 delays, by one unit of time, the encoded data block 3c and the encoded data block 4c (two encoded data blocks, where the two encoded data blocks are the delayed encoded data blocks delayed by the first delayer 1) that are input into the first delayer 2 and that are sequentially arranged, to obtain a delayed encoded data block 3c and a delayed encoded data block 4c that are sequentially arranged, inputs the delayed encoded data block 3c (the first delayed encoded data block) into the first combiner 042, and inputs the delayed encoded data block 4c (the second delayed encoded data block) into the first delayer 3. The first delayer 2 delays, by one unit of time, the encoded data block 3d and the encoded data block 4d (two encoded data blocks, where the two encoded data blocks are the delayed encoded data blocks delayed by the first delayer 1) that are input into the first delayer 2 and that are sequentially arranged, to obtain a delayed encoded data block 3d and a delayed encoded data block 4d that are sequentially arranged, inputs the delayed encoded data block 3d (the first delayed encoded data block) into the first combiner 042, and inputs the delayed encoded data block 4d (the second delayed encoded data block) into the first delayer 3. The first delayer 3 delays, by one unit of time, the encoded data block 4a (the delayed encoded data block delayed by the first delayer 1 and the first delayer 2) input into the first delayer 3, to obtain a delayed encoded data block 4a, and inputs the delayed encoded data block 4a into the first combiner 042. The first delayer 3 delays, by one unit of time, the encoded data block 4b (the delayed encoded data block delayed by the first delayer 1 and the first delayer 2) input into the first delayer 3, to obtain a delayed encoded data block 4b, and inputs the delayed encoded data block 4b into the first combiner 042. The first delayer 3 delays, by one unit of time, the encoded data block 4c (the delayed encoded data block delayed by the first delayer 1 and the first delayer 2) input into the first delayer 3, to obtain a delayed encoded data block 4c, and inputs the delayed encoded data block 4c into the first combiner 042. The first delayer 3 delays, by one unit of time, the encoded data block 4d (the delayed encoded data block delayed by the first delayer 1 and the first delayer 2) input into the first delayer 3, to obtain a delayed encoded data block 4d, and inputs the delayed encoded data block 4d into the first combiner 042.

The first combiner 042 combines the encoded data blocks that correspond to the four encoded codewords and that are input into the first combiner 042, to obtain the convolutional data flow. Specifically, the first combiner 042 may combine, in chronological order, the encoded data blocks that correspond to the four encoded codewords and that are input into the first combiner 042, to obtain the convolutional data flow. The convolutional data flow includes seven (w=m+n*k=4+1*3) convolutional codewords. In the seven convolutional codewords: Three convolutional codewords corresponding to the first three units of time in seven units of time include three convolutional codeword groups, each convolutional codeword group includes one convolutional codeword, and each convolutional codeword includes i first convolutional data blocks and 4−i second convolutional data blocks, where each of the i first convolutional data blocks is an encoded data block in i encoded codewords corresponding to the first i units of time in the four units of time, the i first convolutional data blocks are from the i encoded codewords in a one-to-one correspondence manner, the 4−i second convolutional data blocks are initial data blocks, and data in the initial data block is 0, where 4≥i>0, and i is an integer. Three convolutional codewords corresponding to the last three units of time in the seven units of time include three convolutional codeword groups, each convolutional codeword group includes one convolutional codeword, and each convolutional codeword includes 4−j first convolutional data blocks and j second convolutional data blocks, where each of the 4−j first convolutional data blocks is an encoded data block in 4−j of j encoded codewords corresponding to the last j units of time in the four units of time, the 4−j first convolutional data blocks are from the 4−j encoded codewords in a one-to-one correspondence manner, the j second encoded data blocks are the initial data blocks, and data in the initial data blocks is 0, 4≥j>0, and j is an integer. A convolutional codeword corresponding to each of at least one intermediate unit of time includes four first convolutional data blocks, each of the four first convolutional data blocks is an encoded data block in the four encoded codewords, the four first convolutional data blocks are from the four encoded codewords in a one-to-one correspondence manner, and the intermediate unit of time is a unit of time other than the first three units of time and the last three units of time in the seven units of time.

For example, as shown in FIG. 7A and FIG. 7B, the convolutional data flow includes seven convolutional codewords: a convolutional codeword A, a convolutional codeword B, a convolutional codeword C, a convolutional codeword D, a convolutional codeword E, a convolutional codeword F, and a convolutional codeword G. In the seven convolutional codewords, the three convolutional codewords corresponding to the first three units of time (namely, the moment 1, the moment 2, and the moment 3) in the seven units of time include three convolutional codeword groups: a convolutional codeword group 1 (not marked in FIG. 7A and FIG. 7B), a convolutional codeword group 2 (not marked in FIG. 7A and FIG. 7B), and a convolutional codeword group 3 (not marked in FIG. 7A and FIG. 7B). The convolutional codeword group 1 includes the convolutional codeword A. The convolutional codeword group 2 includes the convolutional codeword B. The convolutional codeword group 3 includes the convolutional codeword C. The convolutional codeword A includes one (i=1) first convolutional data block and three second convolutional data blocks. The first convolutional data block is a convolutional data block 1a. Data in all the three second convolutional data blocks is 0. The convolutional codeword B includes two (i=2) first convolutional data blocks and two second convolutional data blocks. The two first convolutional data blocks are a convolutional data block 1b and a convolutional data block 2a. Data in both the two second convolutional data blocks is 0. The convolutional codeword C includes three (i=3) first convolutional data blocks and one second convolutional data block. The three first convolutional data blocks are a convolutional data block 1c, a convolutional data block 2b, and a convolutional data block 3a. Data in the one second convolutional data block is 0.

The three convolutional codewords corresponding to the last three units of time (namely, a moment 5, a moment 6, and a moment 7) in the seven units of time include three convolutional codeword groups including a convolutional codeword group 1 (not marked in FIG. 7A and FIG. 7B), a convolutional codeword group 2 (not marked in FIG. 7A and FIG. 7B), and a convolutional codeword group 3 (not marked in FIG. 7A and FIG. 7B). The convolutional codeword group 1 includes the convolutional codeword E. The convolutional codeword group 2 includes the convolutional codeword F. The convolutional codeword group 3 includes the convolutional codeword G. The convolutional codeword E includes three (j=1, and 4−j=3) first convolutional data blocks and one second convolutional data block. The three first convolutional data blocks are a convolutional data block 2d, a convolutional data block 3c, and a convolutional data block 4b. Data in the one second convolutional data block is 0. The convolutional codeword F includes two (j=2, and 4−j=2) first convolutional data blocks and two second convolutional data blocks. The two first convolutional data blocks are a convolutional data block 3d and a convolutional data block 4c. Data in both the two second convolutional data blocks is 0. The convolutional codeword G includes one (j=3, and 4−j=1) first convolutional data blocks and three second convolutional data blocks. The one first convolutional data block is a convolutional data block 4d. Data in all the three second convolutional data blocks is 0. The convolutional codeword corresponding to the intermediate unit of time (namely, the moment 4) is the convolutional codeword D. The convolutional codeword D includes four first convolutional data blocks. The four first convolutional data blocks are a convolutional data block 1d, a convolutional data block 2c, a convolutional data block 3b, and a convolutional data block 4a.

With reference to FIG. 4 and FIG. 8A to FIG. 10E, the equalization module 01 includes a second combiner 011, three second delayers, four multi-symbol detectors, four second block dividers, and four first data extractors. The three second delayers are a second delayer 1, a second delayer 2, and a second delayer 3. The four multi-symbol detectors are a multi-symbol detector 1, a multi-symbol detector 2, a multi-symbol detector 3, and a multi-symbol detector 4. The four second block dividers are a second block divider 1, a second block divider 2, a second block divider 3, and a second block divider 4. The four first data extractors are a first data extractor 1, a first data extractor 2, a first data extractor 3, and a first data extractor 4. An output end of the multi-symbol detector 1 is connected to an input end of the second block divider 1. An output end of the multi-symbol detector 2 is connected to an input end of the second block divider 2. An output end of the multi-symbol detector 3 is connected to an input end of the second block divider 3. An output end of the multi-symbol detector 4 is connected to an input end of the second block divider 4. An output end of the second block divider 1 is connected to an input end of the first data extractor 1. An output end of the second block divider 2 is connected to an input end of the first data extractor 2. An output end of the second block divider 3 is connected to an input end of the first data extractor 3. An output end of the second block divider 4 is connected to an input end of the first data extractor 4. An output end of the first data extractor 1, an output end of the first data extractor 2, an output end of the first data extractor 3, and an output end of the first data extractor 4 are separately connected to an input end of the second combiner 011. An output end of the second delayer 1 is connected to an input end of the second delayer 2 and an input end of the multi-symbol detector 2. An output end of the second delayer 2 is connected to an input end of the second delayer 3 and an input end of the multi-symbol detector 3. An output end of the second delayer 3 is connected to an input end of the multi-symbol detector 4. An input end of the second delayer 1 is connected to an input end of the multi-symbol detector 1, and the input end of the second delayer 1 is further connected to the convolution module 04. The input end of the second delayer 1 is connected to the convolution module 04 specifically by using the coherent receiver 08 and the coherent receiver DAC-07.

With reference to FIG. 4, FIG. 8A, FIG. 8B, and FIG. 8C, the convolution module 04 separately inputs the convolutional data flow into the second delayer 1 and the multi-symbol detector 1. The convolutional data flow includes a convolutional codeword A corresponding to a moment 1, a convolutional codeword B corresponding to a moment 2, a convolutional codeword C corresponding to a moment 3, a convolutional codeword D corresponding to a moment 4, a convolutional codeword E corresponding to a moment 5, a convolutional codeword F corresponding to a moment 6, and a convolutional codeword G corresponding to a moment 7.

Figure 8A:
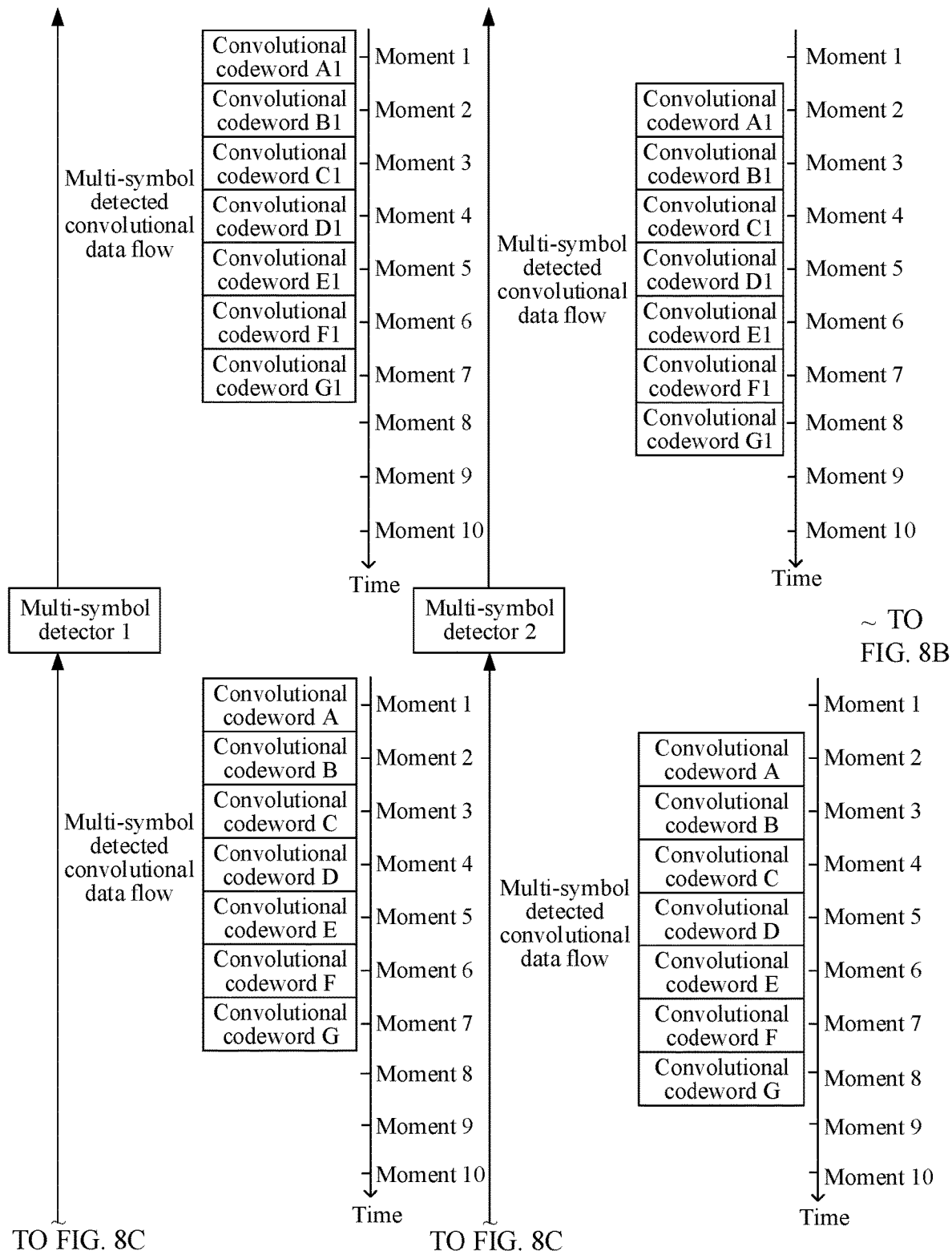
FIG. 8A, FIG. 8B, FIG. 8C, and FIG. 8D are schematic diagrams of a process in which a signal transmission system processes a data flow according to an embodiment of this application.
Figure 8B:
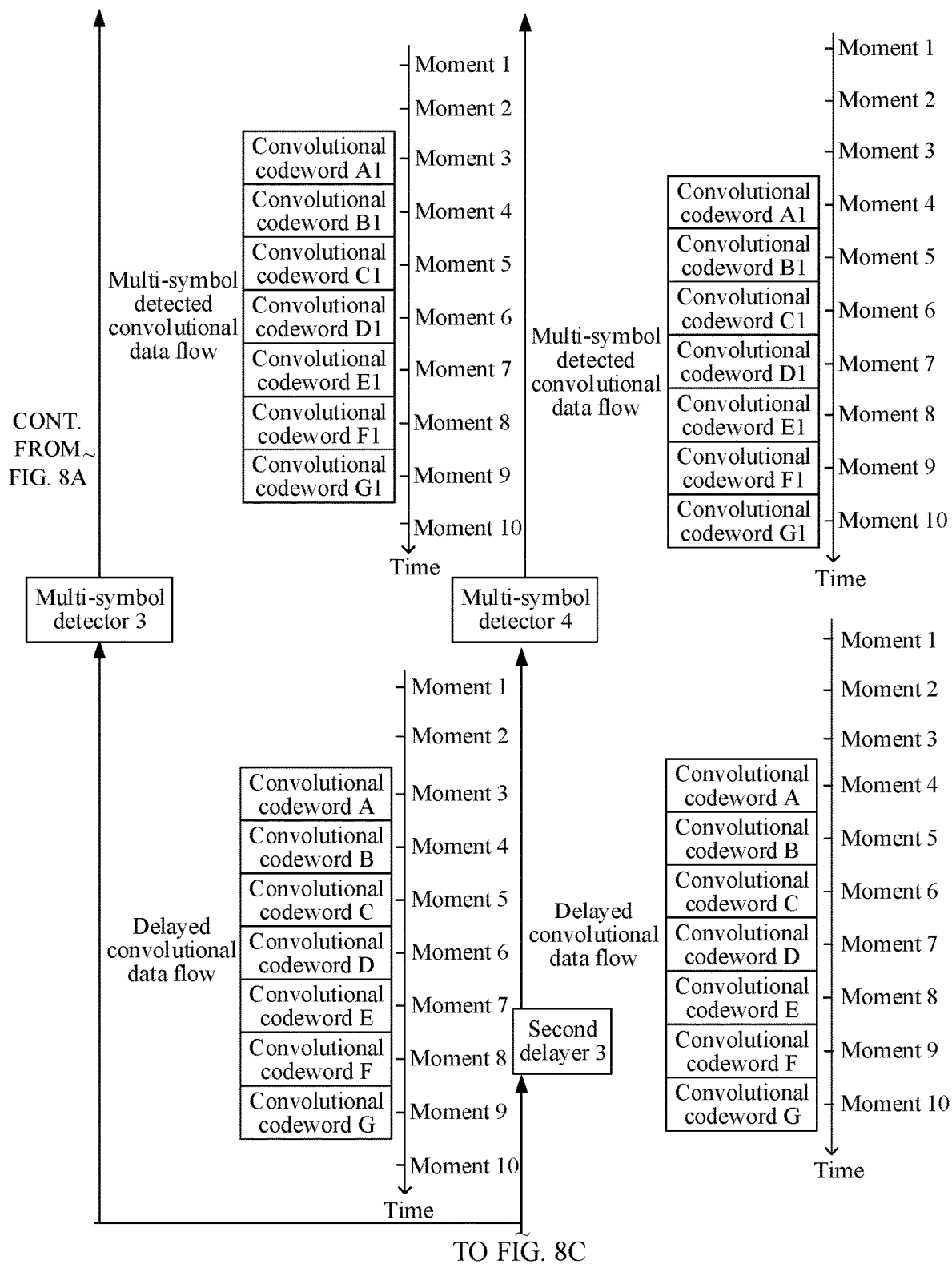
Figure 8C:
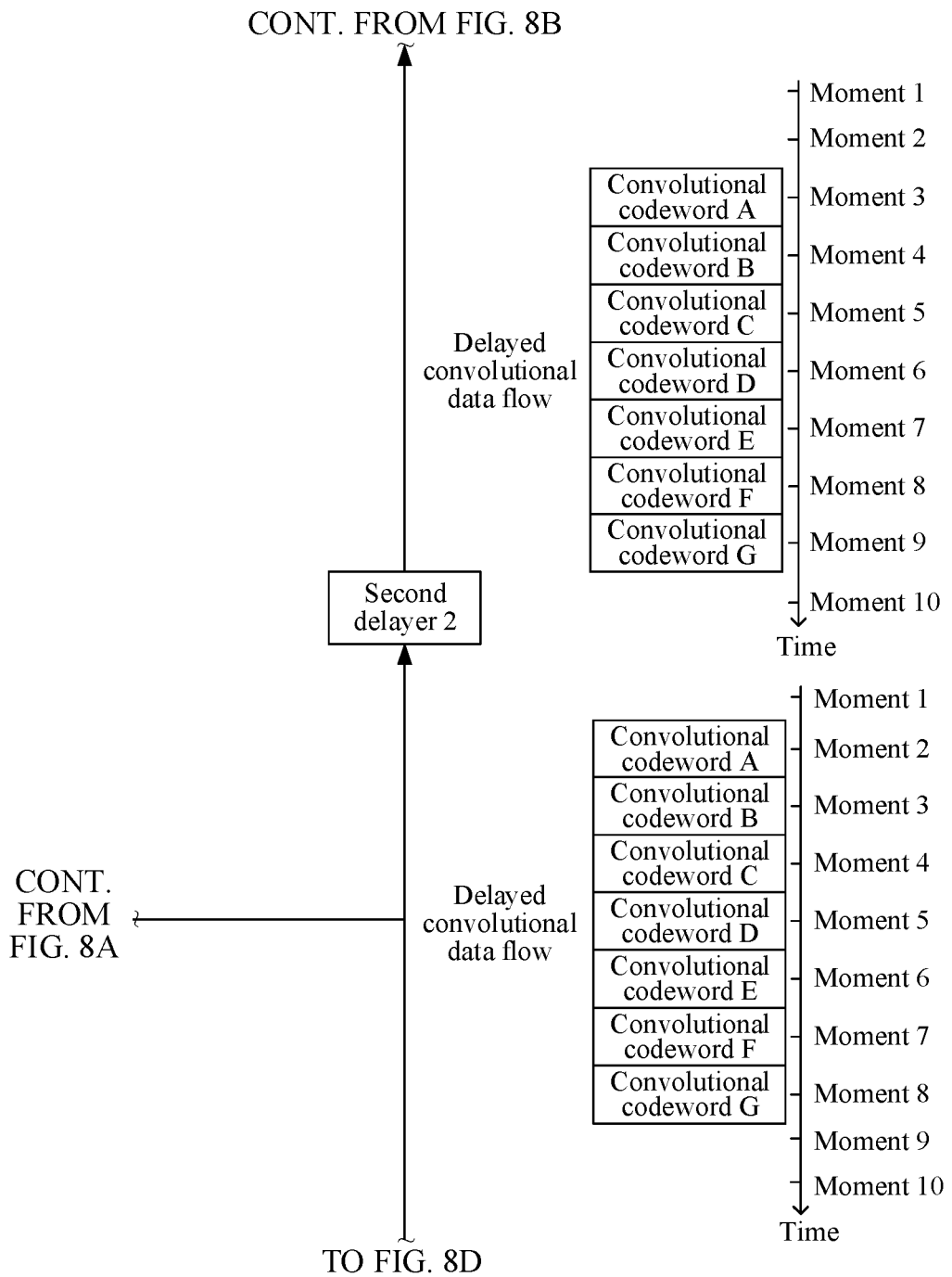
Figure 8D:
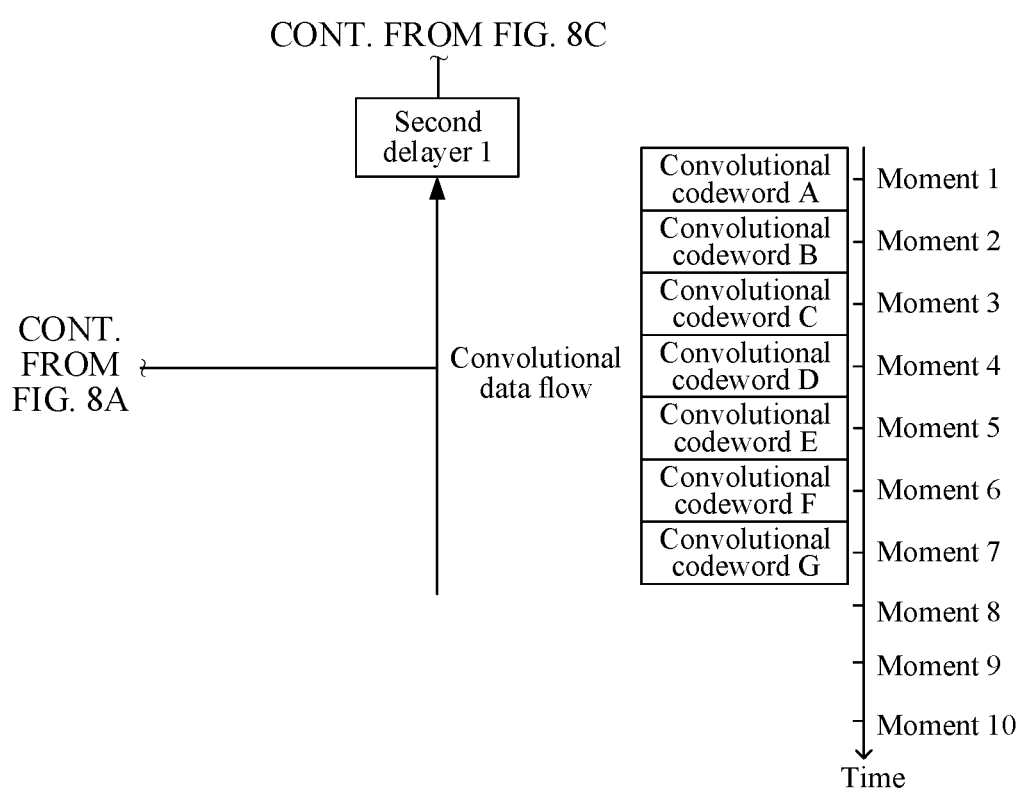
Figure 9A:
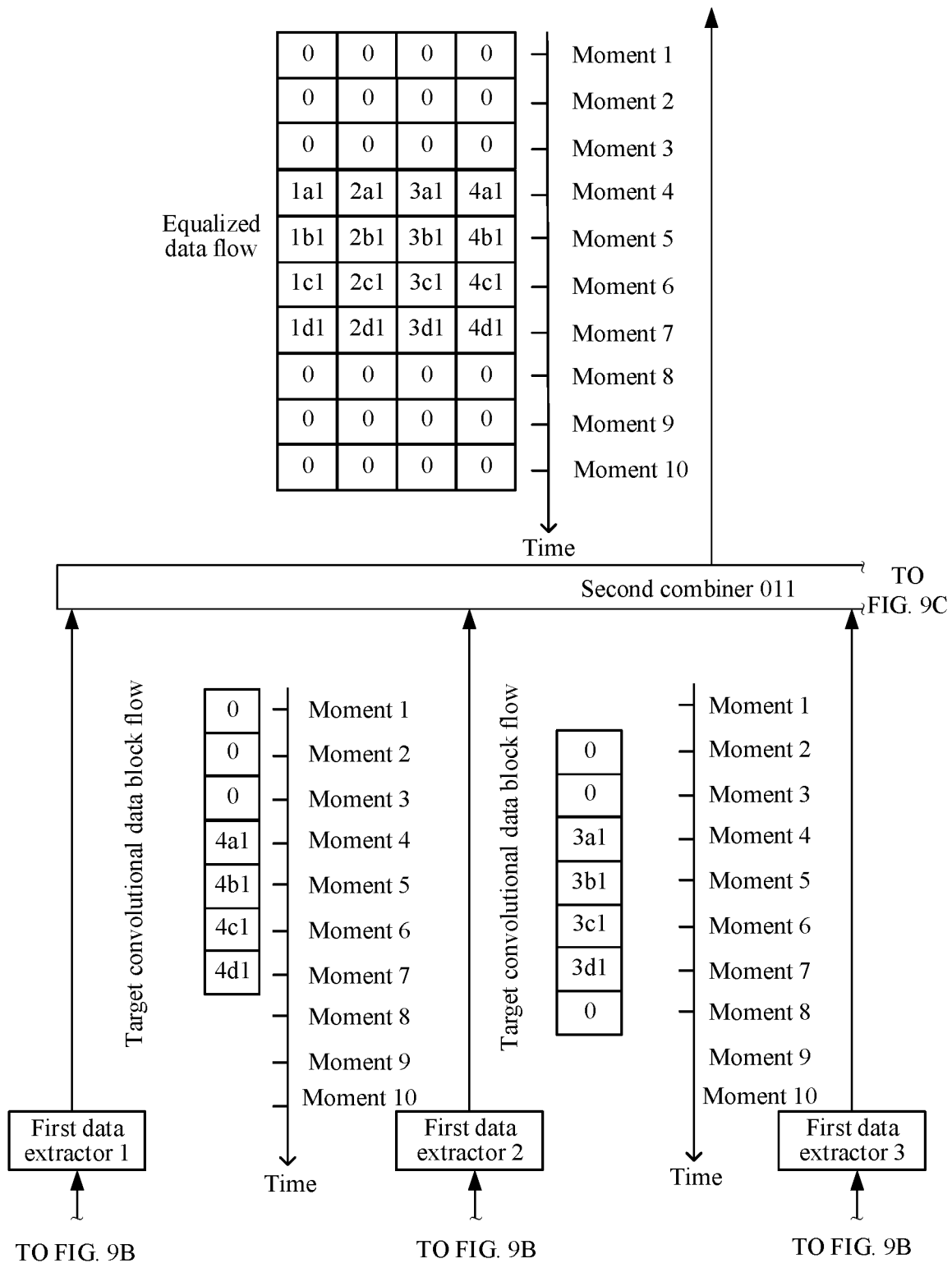
FIG. 9A, FIG. 9B, FIG. 9C, and FIG. 9D are schematic diagrams of a process in which a signal transmission system processes a data flow according to an embodiment of this application.
Figure 9B:
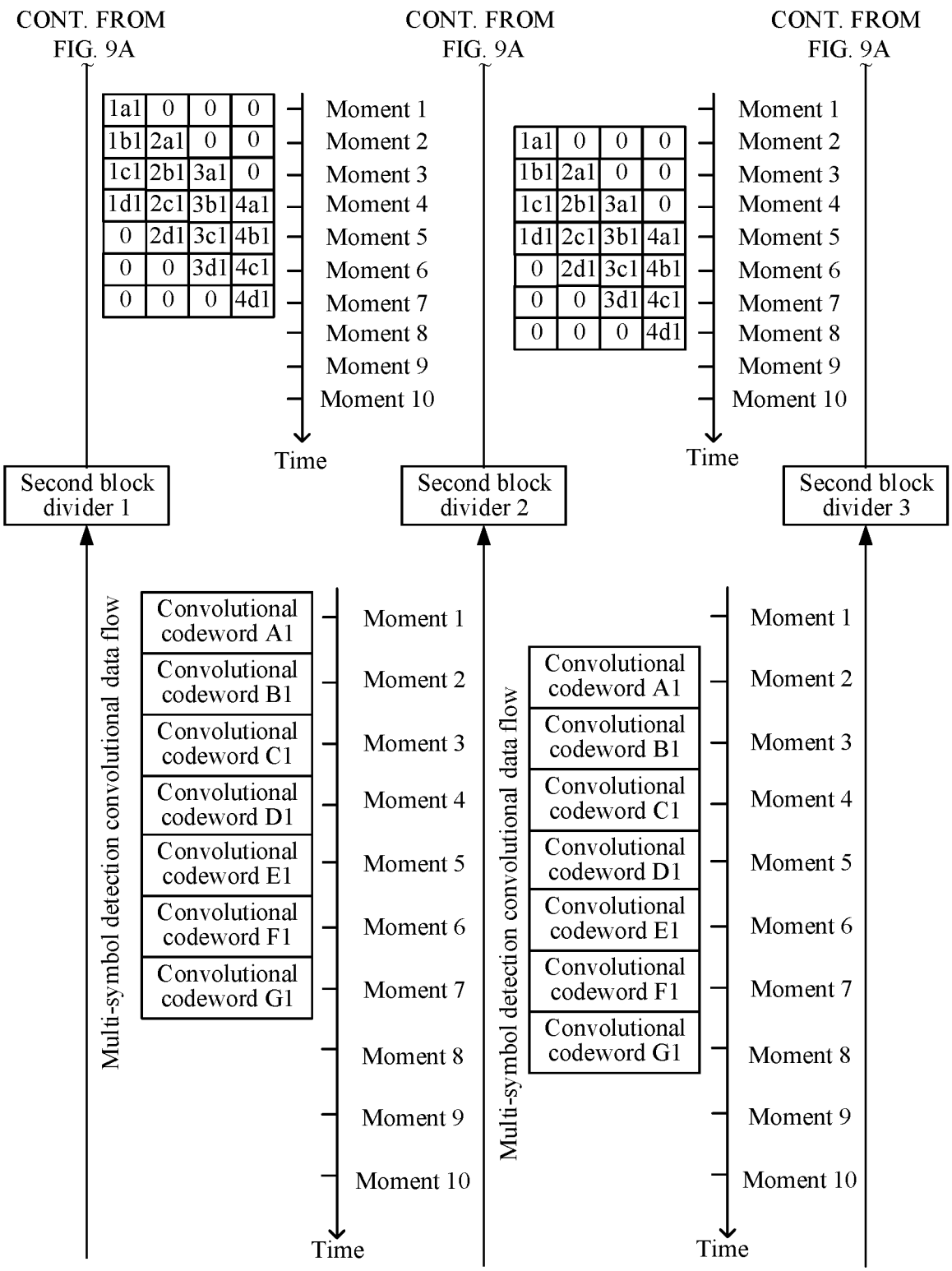
Figure 9C:
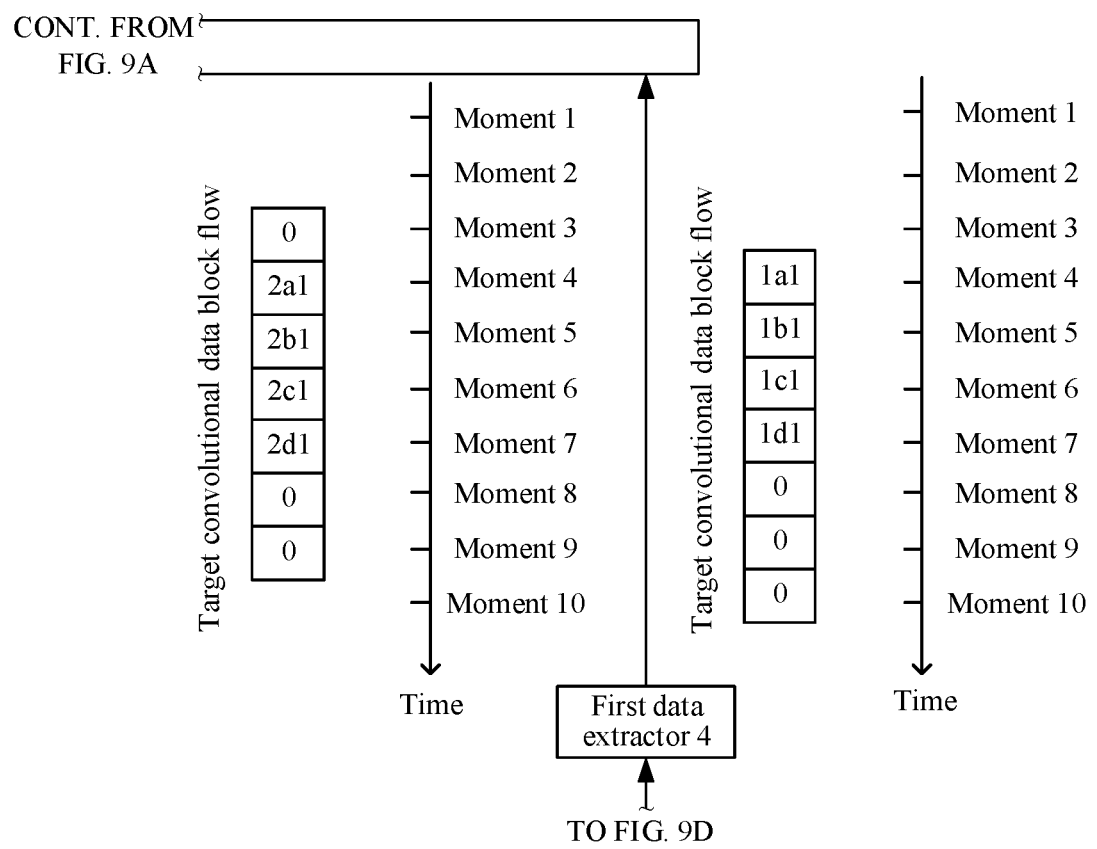
Figure 9D:
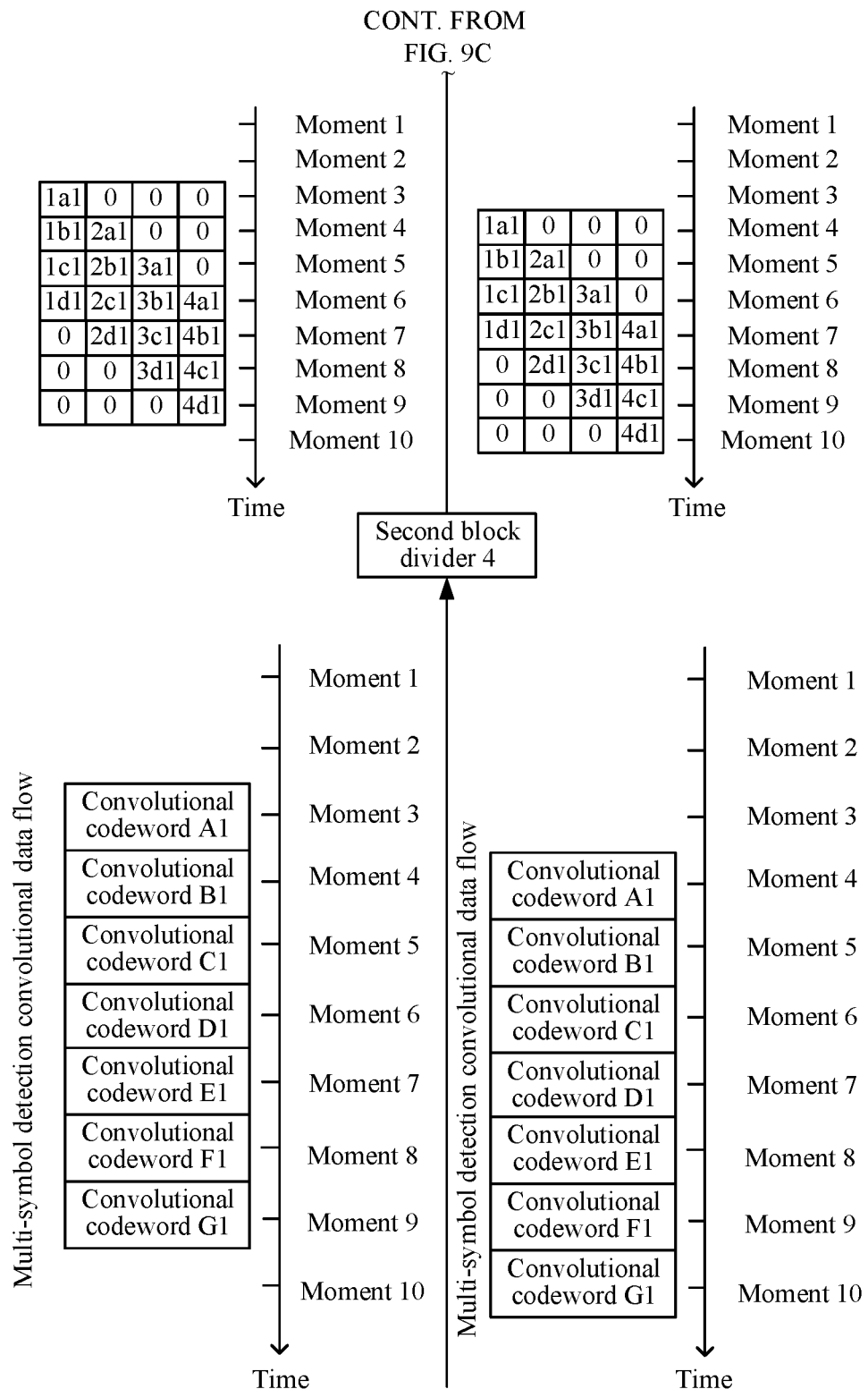
Figure 10A:
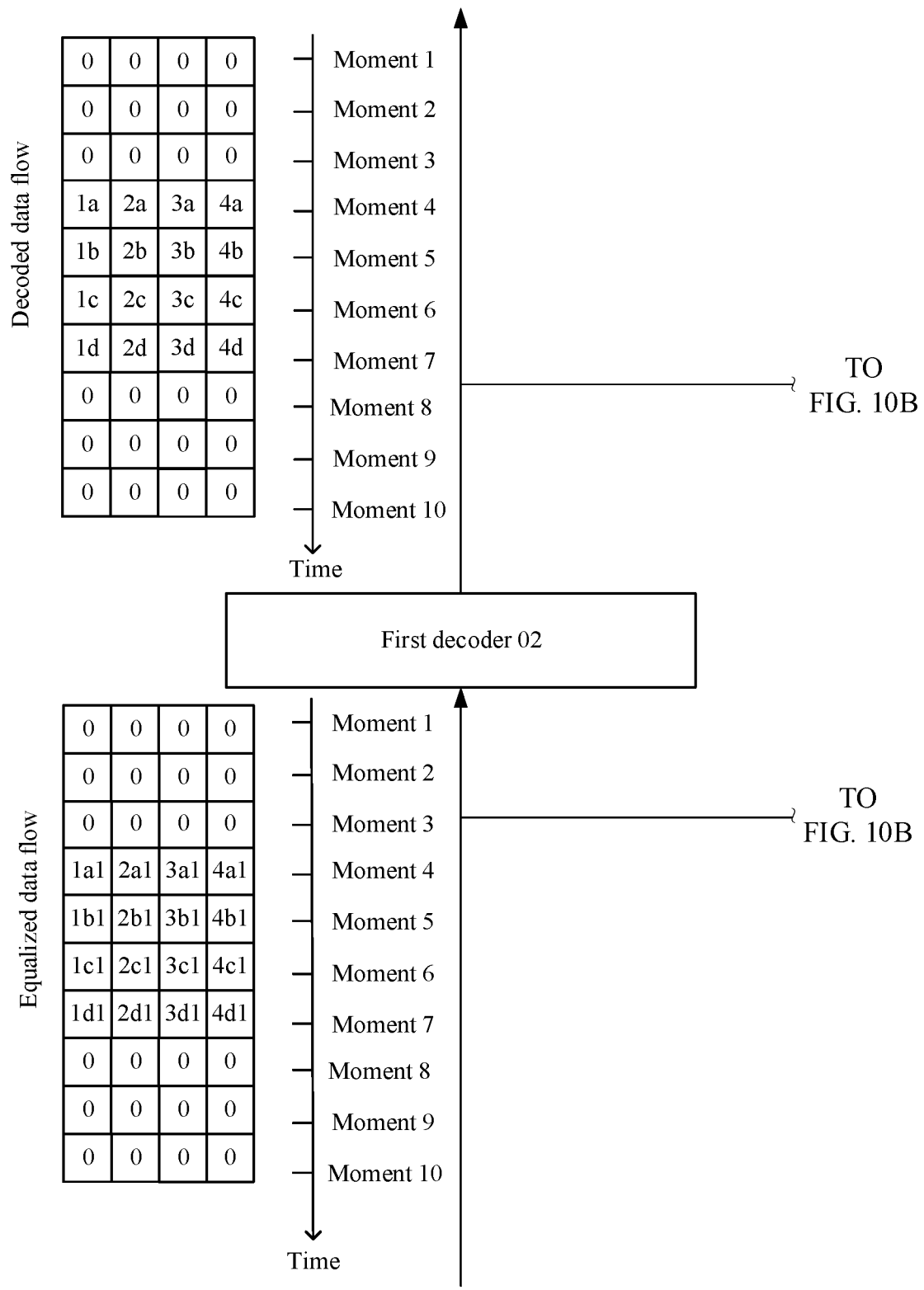
FIG. 10A, FIG. 10B, FIG. 10C, FIG. 10D, and FIG. 10E are schematic diagrams of a process in which a signal transmission system processes a data flow according to an embodiment of this application.
Figure 10B:
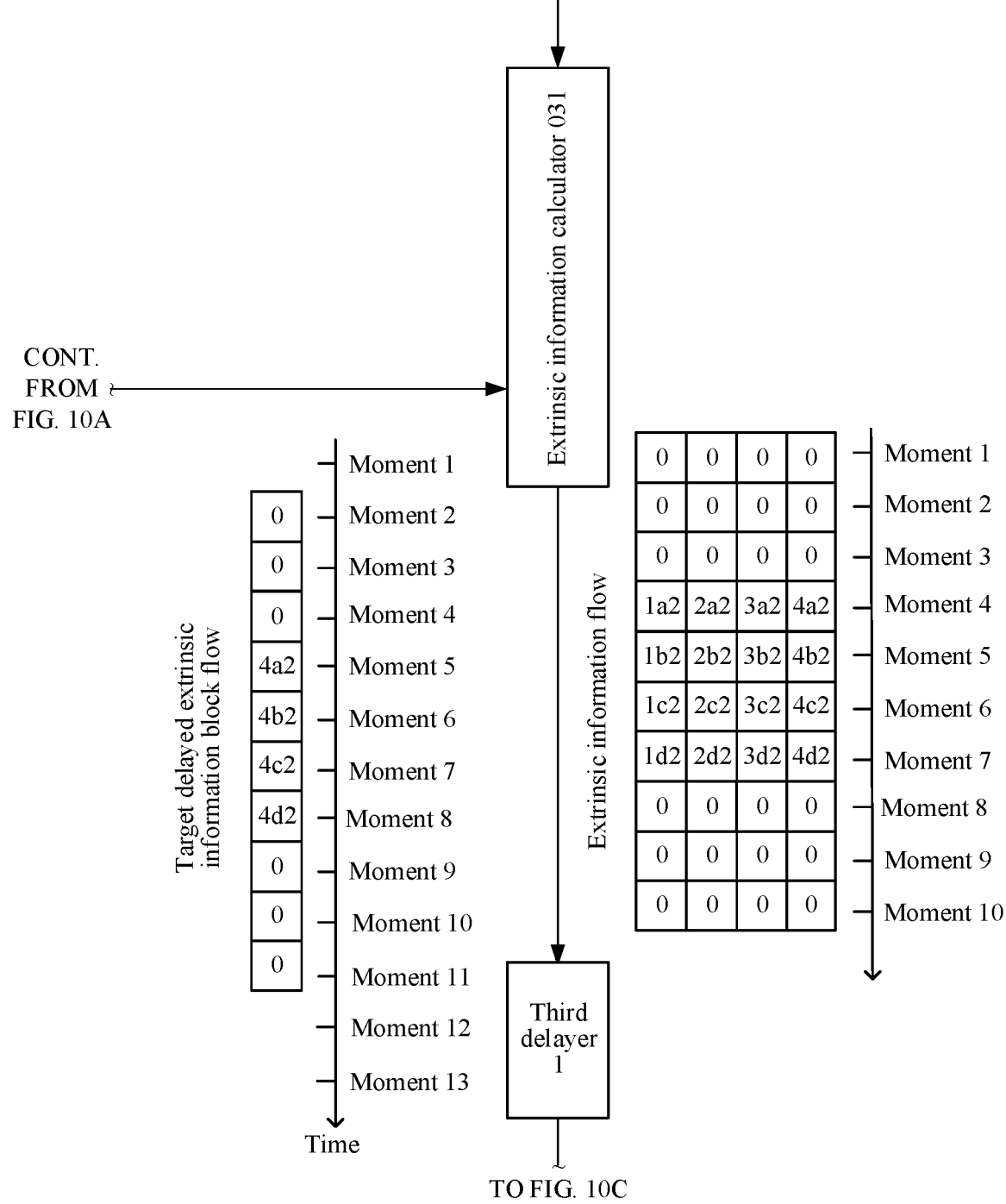
Figure 10C:
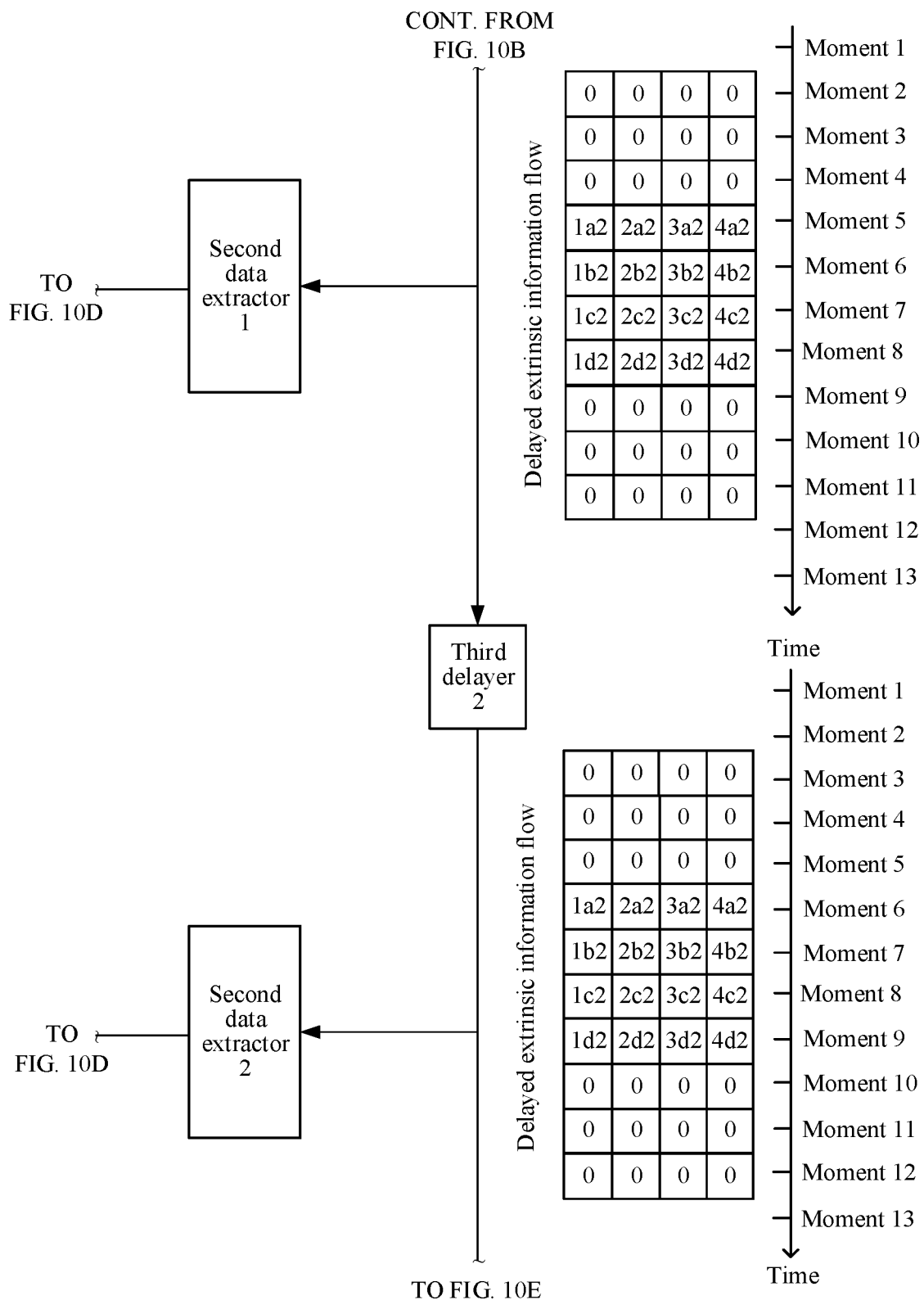
Figure 10D:
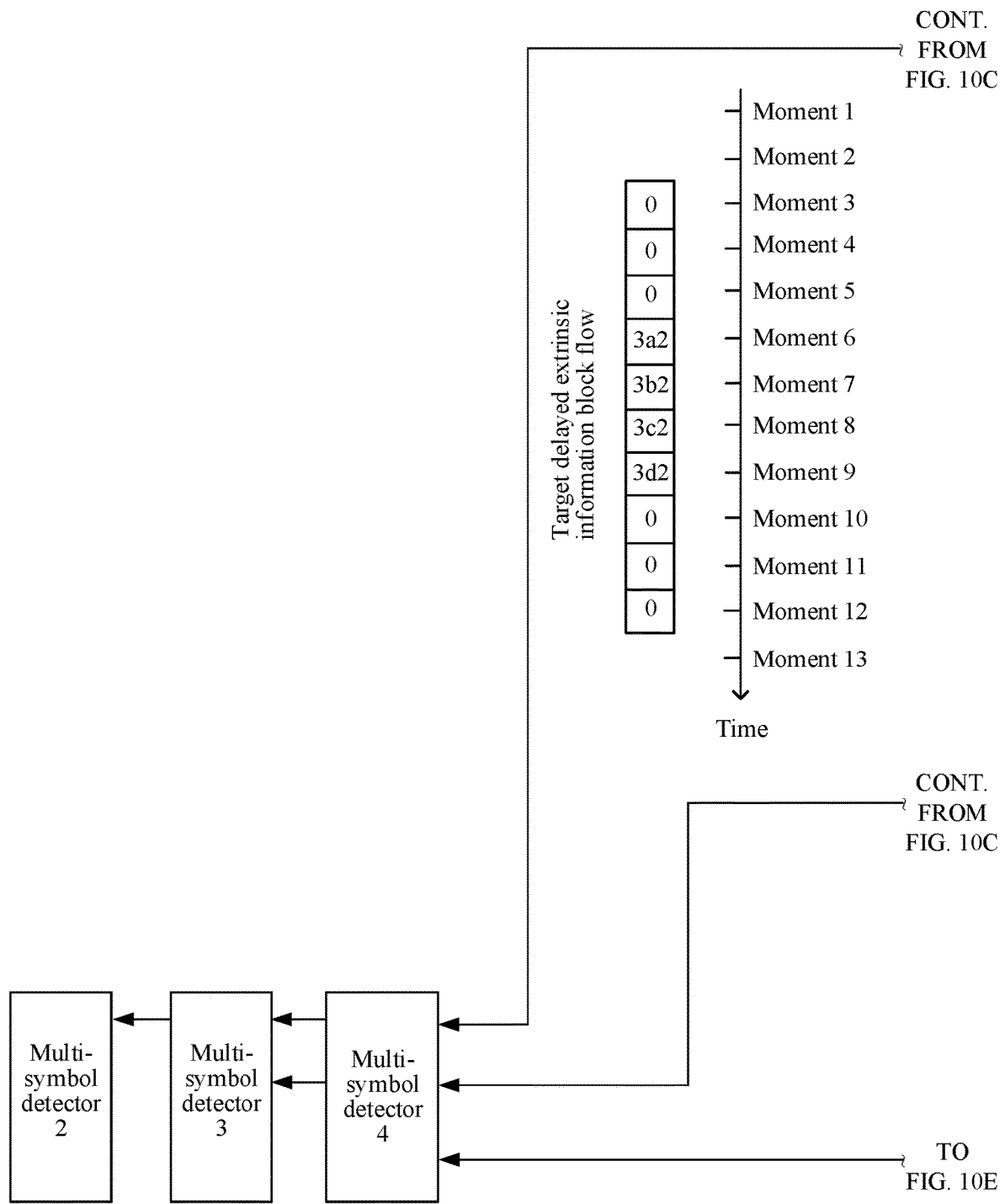
Figure 10E:
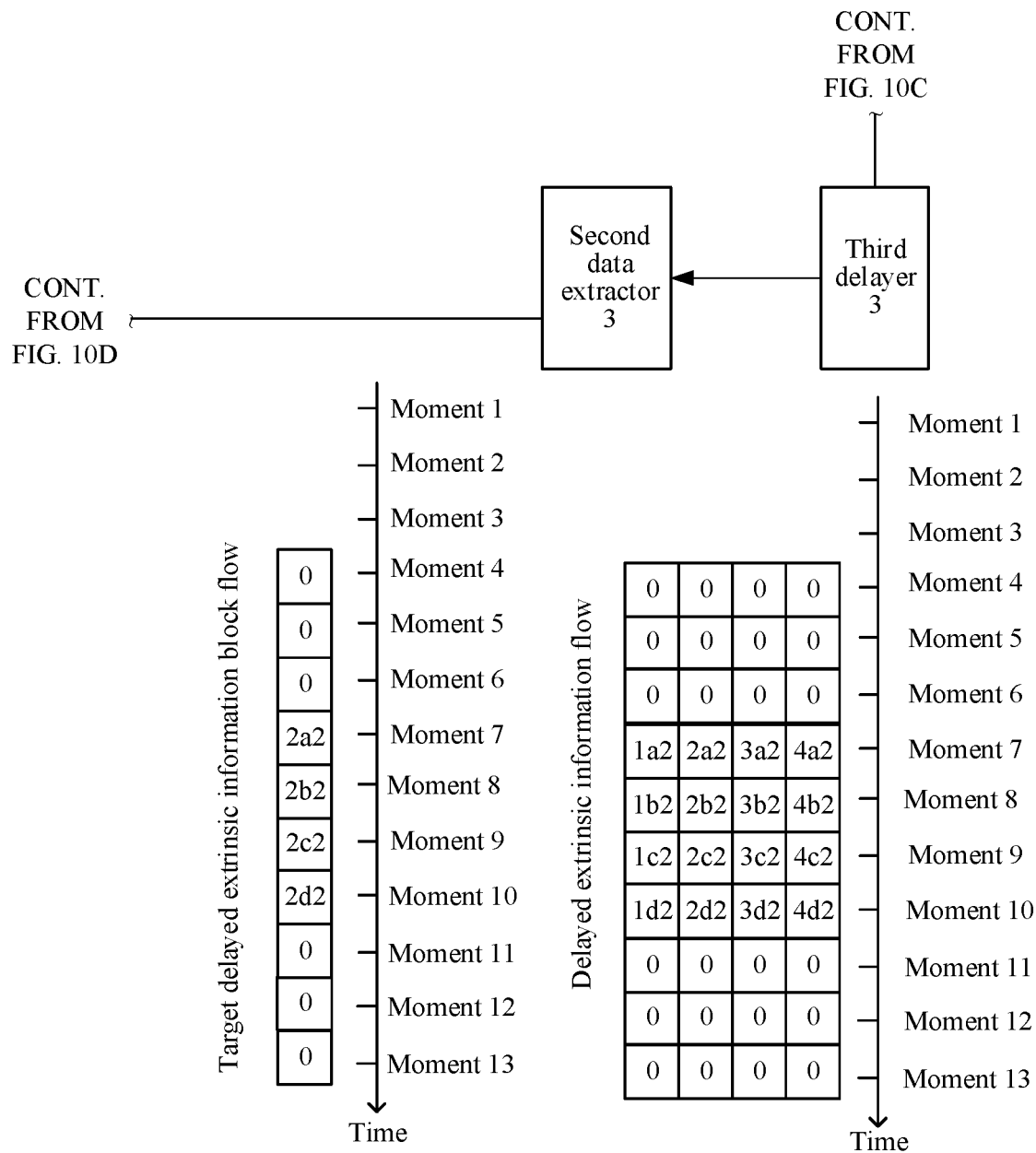

Each of the three second delayers delays, by one unit of time, a convolutional data flow input into the second delayer, to obtain a delayed convolutional data flow, and separately inputs the delayed convolutional data flows into a multi-symbol detector and a next second delayer that are connected to the second delayer. Each delayed convolutional data flow includes seven delayed convolutional codewords in a one-to-one correspondence with seven consecutive units of time. For example, as shown in FIG. 8A, FIG. 8B, and FIG. 8C, the second delayer 1 delays, by one unit of time, the convolutional data flow input into the second delayer 1, to obtain a delayed convolutional data flow, and separately inputs the delayed convolutional data flow into the multi-symbol detector 2 and the second delayer 2. The second delayer 2 delays, by one unit of time, the delayed convolutional data flow input into the second delayer 2, to obtain a delayed convolutional data flow delayed by two units of time, and separately inputs the delayed convolutional data flow into the multi-symbol detector 3 and the second delayer 3. The second delayer 3 delays, by one unit of time, the delayed convolutional data flow input into the second delayer 3, to obtain a delayed convolutional data flow delayed by three units of time, and inputs the delayed convolutional data flow into the multi-symbol detector 4.

Each of the four multi-symbol detectors performs multi-symbol detection processing on the convolutional data flow input into the multi-symbol detector, to obtain a multi-symbol detected convolutional data flow, and inputs the multi-symbol detected convolutional data flow into a second block divider connected to the multi-symbol detector. Each multi-symbol detected convolutional data flow includes seven multi-symbol detected convolutional codewords in a one-to-one correspondence with the seven consecutive units of time. For example, as shown in FIG. 8A, FIG. 8B, and FIG. 8C, the multi-symbol detector 1 performs multi-symbol detection processing on the convolutional data flow input into the multi-symbol detector 1, to obtain a multi-symbol detected convolutional data flow, and inputs the multi-symbol detected convolutional data flow into the second block divider 1. The multi-symbol detected convolutional data flow includes a multi-symbol detected convolutional codeword A1 corresponding to the moment 1, a multi-symbol detected convolutional codeword B1 corresponding to the moment 2, a multi-symbol detected convolutional codeword C1 corresponding to the moment 3, a multi-symbol detected convolutional codeword D corresponding to the moment 4, a multi-symbol detected convolutional codeword E1 corresponding to the moment 5, a multi-symbol detected convolutional codeword F1 corresponding to the moment 6, and a multi-symbol detected convolutional codeword G1 corresponding to the moment 7. The multi-symbol detector 2 performs multi-symbol detection processing on the convolutional data flow (a delayed convolutional data flow) input into the multi-symbol detector 2, to obtain a multi-symbol detected convolutional data flow, and inputs the multi-symbol detected convolutional data flow into the second block divider 2. The multi-symbol detected convolutional data flow includes a multi-symbol detected convolutional codeword A1 corresponding to the moment 2, a multi-symbol detected convolutional codeword B1 corresponding to the moment 3, a multi-symbol detected convolutional codeword C1 corresponding to the moment 4, a multi-symbol detected convolutional codeword D1 corresponding to the moment 5, a multi-symbol detected convolutional codeword E1 corresponding to the moment 6, a multi-symbol detected convolutional codeword F1 corresponding to the moment 7, and a multi-symbol detected convolutional codeword G1 corresponding to a moment 8. The multi-symbol detector 3 performs multi-symbol detection processing on the convolutional data flow (a delayed convolutional data flow) input into the multi-symbol detector 3, to obtain a multi-symbol detected convolutional data flow, and inputs the multi-symbol detected convolutional data flow into the second block divider 3. The multi-symbol detected convolutional data flow includes a multi-symbol detected convolutional codeword A1 corresponding to the moment 3, a multi-symbol detected convolutional codeword B1 corresponding to the moment 4, a multi-symbol detected convolutional codeword C1 corresponding to the moment 5, a multi-symbol detected convolutional codeword D1 corresponding to the moment 6, a multi-symbol detected convolutional codeword E1 corresponding to the moment 7, a multi-symbol detected convolutional codeword F1 corresponding to the moment 8, and a multi-symbol detected convolutional codeword G1 corresponding to a moment 9. The multi-symbol detector 4 performs multi-symbol detection processing on the convolutional data flow (a delayed convolutional data flow) input into the multi-symbol detector 4, to obtain a multi-symbol detected convolutional data flow, and inputs the multi-symbol detected convolutional data flow into the second block divider 4. The multi-symbol detected convolutional data flow includes a multi-symbol detected convolutional codeword A1 corresponding to the moment 4, a multi-symbol detected convolutional codeword B1 corresponding to the moment 5, a multi-symbol detected convolutional codeword C1 corresponding to the moment 6, a multi-symbol detected convolutional codeword D1 corresponding to the moment 7, a multi-symbol detected convolutional codeword E1 corresponding to the moment 8, a multi-symbol detected convolutional codeword F1 corresponding to the moment 9, and a multi-symbol detected convolutional codeword G1 corresponding to a moment 10.

Each of the four second block dividers divides each multi-symbol convolutional codeword in the multi-symbol detected convolutional data flow input into the second block divider into four convolutional data blocks, to obtain four convolutional data block flows, and inputs the four convolutional data block flows into a first data extractor connected to the second block divider. For example, as shown in FIG. 9A, FIG. 9B, FIG. 9C, and FIG. 9D, the second block divider 1 divides the multi-symbol convolutional codeword A1 in the multi-symbol detected convolutional data flow input into the second block divider 1 into four convolutional data blocks: a convolutional data block 1*a*1, a convolutional data block 0, a convolutional data block 0, and a convolutional data block 0 that are sequentially arranged. The second block divider 1 divides the multi-symbol convolutional codeword B1 in the multi-symbol detected convolutional data flow input into the second block divider 1 into four convolutional data blocks: a convolutional data block 1*b*1, a convolutional data block 2*a*1, a convolutional data block 0, and a convolutional data block 0 that are sequentially arranged. The second block divider 1 divides the multi-symbol convolutional codeword C1 in the multi-symbol detected convolutional data flow input into the second block divider 1 into four convolutional data blocks: a convolutional data block 1*c*1, a convolutional data block 2*b*1, a convolutional data block 3*a*1, and a convolutional data block 0 that are sequentially arranged. The second block divider 1 divides the multi-symbol convolutional codeword D1 in the multi-symbol detected convolutional data flow input into the second block divider 1 into four convolutional data blocks: a convolutional data block 1*d*1, a convolutional data block 2*c*1, a convolutional data block 3*b*1, and a convolutional data block 4*a*1 that are sequentially arranged. The second block divider 1 divides the multi-symbol convolutional codeword E1 in the multi-symbol detected convolutional data flow input into the second block divider 1 into a convolutional data block 0, a convolutional data block 2*d*1, a convolutional data block 3*c*1, and a convolutional data block 4*b*1 that are sequentially arranged. The second block divider 1 divides the multi-symbol convolutional codeword F1 in the multi-symbol detected convolutional data flow input into the second block divider 1 into a convolutional data block 0, a convolutional data block 0, a convolutional data block 3*d*1, and a convolutional data block 4*c*1 that are sequentially arranged. The second block divider 1 divides the multi-symbol convolutional codeword G1 in the multi-symbol detected convolutional data flow input into the second block divider 1 into a convolutional data block 0, a convolutional data block 0, a convolutional data block 0, and a convolutional data block 4*d*1 that are sequentially arranged. Then, the second block divider 1 may obtain four convolutional data block flows. The four convolutional data block flows are a convolutional data block flow including the convolutional data block 1*a*1, the convolutional data block 1*b*1, the convolutional data block 1*c*1, the convolutional data block 1*d*1, the convolutional data block 0, the convolutional data block 0, and the convolutional data block 0 that are sequentially arranged in chronological order, a convolutional data block flow including the convolutional data block 0, the convolutional data block 2*a*1, the convolutional data block 2*b*1, the convolutional data block 2*c*1, the convolutional data block 2*d*1, the convolutional data block 0, and the convolutional data block 0 that are sequentially arranged in chronological order, a convolutional data block flow including the convolutional data block 0, the convolutional data block 0, the convolutional data block 3*a*1, the convolutional data block 3*b*1, the convolutional data block 3*c*1, the convolutional data block 3*d*1, and the convolutional data block 0 that are sequentially arranged in chronological order, and a convolutional data block flow including the convolutional data block 0, and the convolutional data block 0, the convolutional data block 0, the convolutional data block 4a1, the convolutional data block 4b1, the convolutional data block 4c1, and the convolutional data block 4d1 that are sequentially arranged in chronological order. Then, the second block divider 1 may input the four convolutional data block flows into the first data extractor 1. For block division processes of the second block divider 2, the second block divider 3, and the second block divider 4, refer to the block division process of the second block divider 1. Details are not described herein again.

Each of the four first data extractors extracts a target convolutional data block flow from four convolutional data block flows input into the first data extractor, and inputs the extracted target convolutional data block flow into the second combiner 011. For example, as shown in FIG. 9A, FIG. 9B, FIG. 9C, and FIG. 9D, the first data extractor 1 extracts, as a target convolutional data block flow, the convolutional data block flow including the convolutional data block 0, the convolutional data block 0, the convolutional data block 0, the convolutional data block 4a1, the convolutional data block 4b1, the convolutional data block 4c1, and the convolutional data block 4d1 that are sequentially arranged from a moment 1 to a moment 7 from the four convolutional data block flows input into the first data extractor 1, and inputs the target convolutional data block flow into the second combiner 011. The first data extractor 2 extracts, as a target convolutional data block flow, a convolutional data block flow including a convolutional data block 0, a convolutional data block 0, a convolutional data block 3a1, a convolutional data block 3b1, a convolutional data block 3c1, a convolutional data block 3d1, and a convolutional data block 0 that are sequentially arranged from a moment 2 to a moment 8 from four convolutional data block flows input into the first data extractor 2, and inputs the target convolutional data block flow into the second combiner 011. The first data extractor 3 extracts, as a target convolutional data block flow, a convolutional data block flow including a convolutional data block 0, a convolutional data block 2a1, a convolutional data block 2b1, a convolutional data block 2c1, a convolutional data block 2d1, a convolutional data block 0, and a convolutional data block 0 that are sequentially arranged from a moment 3 to a moment 9 from four convolutional data block flows input into the first data extractor 3, and inputs the target convolutional data block flow into the second combiner 011. The first data extractor 4 extracts, as a target convolutional data block flow, a convolutional data block flow including a convolutional data block 1a1, a convolutional data block 1b1, a convolutional data block 1c1, a convolutional data block 1d1, a convolutional data block 0, a convolutional data block 0, and a convolutional data block 0 that are sequentially arranged from a moment 4 to a moment 10 from four convolutional data block flows input into the first data extractor 4, and inputs the target convolutional data block flow into the second combiner 011.

The second combiner 011 combines the four target convolutional data block flows input into the second combiner 011, to obtain the equalized data flow. Optionally, the second combiner 011 combines, in chronological order, the four target convolutional data block flows input into the second combiner 011, to obtain the equalized data flow. The equalized data flow includes four target convolutional data block flows. Each target convolutional data block flow includes one equalized data block in each of 10 (g=m+2n*k=4+2*1*3=10) equalized codewords. In the 10 equalized codewords: an equalized codeword corresponding to each of the first three units of time and the last three units of time in the 10 units of time includes four initial data blocks, and data in the initial data blocks is 0; and an equalized codeword corresponding to each of intermediate units of time in the 10 units of time includes: equalized data blocks obtained after convolution processing and equalization processing are sequentially performed on four encoded data blocks in the corresponding encoded codeword, where the intermediate units of time are units of time other than the first three units of time and the last three units of time in the ten units of time. For example, as shown in FIG. 9A, FIG. 9B, FIG. 9C, and FIG. 9D, the second combiner 011 combines the four target convolutional data block flows of the second combiner 011 to obtain the equalized data flow. Each target convolutional data block flow includes one equalized data block in each of the 10 equalized codewords. In the 10 equalized codewords, an equalized codeword corresponding to each moment in the moment 1, the moment 2, the moment 3 (where the moment 1, the moment 2, the moment 3 are the first three units of time), the moment 8, the moment 9, and the moment 10 (where the moment 8, the moment 9, and the moment 10 are the last three units of time) includes four initial data blocks. Data in the initial data blocks is 0. An equalized codeword corresponding to the moment 4 includes an equalized data block 1a1, an equalized data block 2a1, an equalized data block 3a1, and an equalized data block 4a1. The equalized data block 1a1, the equalized data block 2a1, the equalized data block 3a1, and the equalized data block 4a1 are obtained by separately performing convolution processing and equalization processing on the encoded data block 1a, the encoded data block 2a, the encoded data block 3a, and the encoded data block 4a. An equalized codeword corresponding to the moment 5 includes an equalized data block 1b1, an equalized data block 2b1, an equalized data block 3b1, and an equalized data block 4b1. The equalized data block 1b1, the equalized data block 2b1, the equalized data block 3b1, and the equalized data block 4b1 are obtained by separately performing convolution processing and equalization processing on the encoded data block 1b, the encoded data block 2b, the encoded data block 3b, and the encoded data block 4b. An equalized codeword corresponding to the moment 6 includes an equalized data block 1c1, an equalized data block 2c1, an equalized data block 3c1, and an equalized data block 4c1. The equalized data block 1c1, the equalized data block 2c1, the equalized data block 3c1, and the equalized data block 4c1 are obtained by separately performing convolution processing and equalization processing on the encoded data block 1c, the encoded data block 2c, the encoded data block 3c, and the encoded data block 4c. An equalized codeword corresponding to the moment 7 includes an equalized data block 1d1, an equalized data block 2d1, an equalized data block 3d1, and an equalized data block 4d1. The equalized data block 1d1, the equalized data block 2d1, the equalized data block 3d1, and the equalized data block 4d1 are obtained by separately performing convolution processing and equalization processing on the encoded data block 1d, the encoded data block 2d, the encoded data block 3d, and the encoded data block 4d.

With reference to FIG. 4, FIG. 10A, FIG. 10B, FIG. 10C, FIG. 10D, and FIG. 10E, the feedback module 03 includes an extrinsic information calculator 031, three third delayers, and three second data extractors. The three third delayers are a third delayer 1, a third delayer 2, and a third delayer 3. The three second data extractors are a second data extractor 1, a second data extractor 2, and a second data extractor 3. An input end of the extrinsic information calculator 031 is connected to an output end of the first decoder 02 and an input end of the first decoder 02. An output end of the extrinsic information calculator 031 is connected to an input end of the third delayer 1. An output end of the third delayer 1 is connected to an input end of the third delayer 2 and an input end of the second data extractor 1. An output end of the third delayer 2 is connected to an input end of the third delayer 3 and an input end of the second data extractor 2. An output end of the third delayer 3 is connected to an input end of the second data extractor 3. An output end of the second data extractor 1 is connected to an input end of the multi-symbol detector 4, an input end of the multi-symbol detector 3, and an input end of the multi-symbol detector 2. An output end of the second data extractor 2 is connected to the input end of the multi-symbol detector 4 and the input end of the multi-symbol detector 3. An output end of the second data extractor 3 is connected to the input end of the multi-symbol detector 4.

The extrinsic information calculator 031 calculates an extrinsic information flow of the first decoder 02 based on the decoded data flow output by the first decoder 02 and the equalized data flow input into the first decoder 02. The extrinsic information flow includes four extrinsic information block flows. The four extrinsic information block flows are calculated by the extrinsic information calculator based on four decoded data block flows and four target convolutional data block flows of the equalized data flow. Optionally, the extrinsic information calculator 031 may be a subtractor. The extrinsic information calculator 031 may subtract the equalized data flow from the decoded data flow to obtain the extrinsic information flow. Specifically, the extrinsic information calculator 031 subtracts each codeword block in the equalized data flow from each codeword block in the decoded data flow to obtain an extrinsic information block, further obtain an extrinsic information block flow, and finally obtain the extrinsic information flow. As shown in FIG. 10A, FIG. 10B, FIG. 10C, FIG. 10D, and FIG. 10E, the extrinsic information flow includes four extrinsic information block flows. The four extrinsic information block flows are: an extrinsic information block flow including an extrinsic information block 0, an extrinsic information block 0, an extrinsic information block 0, an extrinsic information block 1$a$2, an extrinsic information block 1$b$2, an extrinsic information block 1$c$2, an extrinsic information block 1$d$2, an extrinsic information block 0, an extrinsic information block 0, and an extrinsic information block 0 that are sequentially arranged in chronological order, an extrinsic information block flow including an extrinsic information block 0, an extrinsic information block 0, an extrinsic information block 0, an extrinsic information block 2$a$2, an extrinsic information block 2$b$2, an extrinsic information block 2$c$2, an extrinsic information block 2$d$2, an extrinsic information block 0, an extrinsic information block 0, and an extrinsic information block 0 that are sequentially arranged in chronological order, an extrinsic information block flow including an extrinsic information block 0, an extrinsic information block 0, an extrinsic information block 0, an extrinsic information block 3$a$2, an extrinsic information block 3$b$2, an extrinsic information block 3$c$2, an extrinsic information block 3$d$2, an extrinsic information block 0, an extrinsic information block 0, and an extrinsic information block 0 that are sequentially arranged in chronological order, and an extrinsic information block flow including an extrinsic information block 0, an extrinsic information block 0, an extrinsic information block 0, an extrinsic information block 4$a$2, an extrinsic information block 4$b$2, an extrinsic information block 4$c$2, an extrinsic information block 4$d$2, an extrinsic information block 0, an extrinsic information block 0, and an extrinsic information block 0 that are sequentially arranged in chronological order.

Each of the three third delayers delays, by one unit of time, an extrinsic information flow input into the third delayer, to obtain a delayed extrinsic information flow, and inputs the delayed extrinsic information flow into a second data extractor and a next third delayer that are connected to the third delayer. Each delayed extrinsic information flow includes four delayed extrinsic information block flows. For example, as shown in FIG. 10A, FIG. 10B, FIG. 10C, FIG. 10D, and FIG. 10E, the third delayer 1 delays, by one unit of time, an extrinsic information flow input into the third delayer 1 to obtain a delayed extrinsic information flow, and inputs the delayed extrinsic information flow into the second data extractor 1 and the third delayer 2. The third delayer 2 delays, by one unit of time, the extrinsic information flow input into the third delayer 2, to obtain a delayed extrinsic information flow, and inputs the delayed extrinsic information flow into the second data extractor 2 and the third delayer 3. The third delayer 3 delays, by one unit of time, the extrinsic information flow input into the third delayer 3, to obtain a delayed extrinsic information flow, and inputs the delayed extrinsic information flow into the second data extractor 3.

Each of the three second data extractors extracts a target delayed extrinsic information block flow from four delayed extrinsic information block flows of the delayed extrinsic information flow input into the second data extractor, and inputs the extracted target delayed extrinsic information block flow into a multi-symbol detector connected to the second data extractor. For example, as shown in FIG. 10A, FIG. 10B, FIG. 10C, FIG. 10D, and FIG. 10E, the second data extractor 1 extracts a target delayed extrinsic information block flow from four delayed extrinsic information block flows of the delayed extrinsic information flow input into the second data extractor 1, and inputs the target delayed extrinsic information block flow into the multi-symbol detector 4, the multi-symbol detector 3, and the multi-symbol detector 2. The target delayed extrinsic information block flow is a delayed extrinsic information block flow including the delayed extrinsic information block 0, the delayed extrinsic information block 0, the delayed extrinsic information block 0, the delayed extrinsic information block 4$a$2, the delayed extrinsic information block 4$b$2, the delayed extrinsic information block 4$c$2, the delayed extrinsic information block 4$d$2, the delayed extrinsic information block 0, the delayed extrinsic information block 0, and the delayed extrinsic information block 0 that are sequentially arranged from the moment 2 to a moment 11. The second data extractor 2 extracts a target delayed extrinsic information block flow from four delayed extrinsic information block flows of the delayed extrinsic information flow input into the second data extractor 2, and inputs the target delayed extrinsic information block flow into the multi-symbol detector 4 and the multi-symbol detector 3. The target delayed extrinsic information block flow is a delayed extrinsic information block flow including the delayed extrinsic information block 0, the delayed extrinsic information block 0, the delayed extrinsic information block 0, the delayed extrinsic information block 3$a$2, the delayed extrinsic information block 3$b$2, the delayed extrinsic information block 3$c$2, the delayed extrinsic information block 3$d$2, the delayed extrinsic information block 0, the delayed extrinsic information block 0, and the delayed extrinsic information block 0 that are sequentially arranged from the moment 3 to a moment 12. The second data extractor 3 extracts a target delayed extrinsic information block flow from four delayed extrinsic information block flows of the delayed extrinsic information flow input into the second data extractor 3, and inputs the target delayed extrinsic information block flow into the multi-symbol detector 4. The target delayed extrinsic information block flow is a delayed extrinsic information block flow including the delayed extrinsic information block 0, the delayed extrinsic information block 0, the delayed extrinsic information block 0, the delayed extrinsic information block 2a2, the delayed extrinsic information block 2b2, the delayed extrinsic information block 2c2, the delayed extrinsic information block 2d2, the delayed extrinsic information block 0, the delayed extrinsic information block 0, and the delayed extrinsic information block 0 that are sequentially arranged from the moment 4 to a moment 13.

Each of the four multi-symbol detectors performs, based on the target delayed extrinsic information block flow fed back by the second data extractor connected to the multi-symbol detector, multi-symbol detection processing on a convolutional data flow input into the multi-symbol detector. For example, the multi-symbol detector 2 performs, based on the target delayed extrinsic information block flow fed back by the second data extractor 1, multi-symbol detection processing on a convolutional data flow input into the multi-symbol detector 2. The multi-symbol detector 3 performs, based on the target delayed extrinsic information block flow fed back by the second data extractor 1 and the target delayed extrinsic information block flow fed back by the second data extractor 2, multi-symbol detection processing on a convolutional data flow input into the multi-symbol detector 3. The multi-symbol detector 4 performs, based on the target delayed extrinsic information block flow fed back by the second data extractor 1, the target delayed extrinsic information block flow fed back by the second data extractor 2, and the target delayed extrinsic information block flow fed back by the second data extractor 3, multi-symbol detection processing on a convolutional data flow input into the multi-symbol detector 4.

Figure 11:
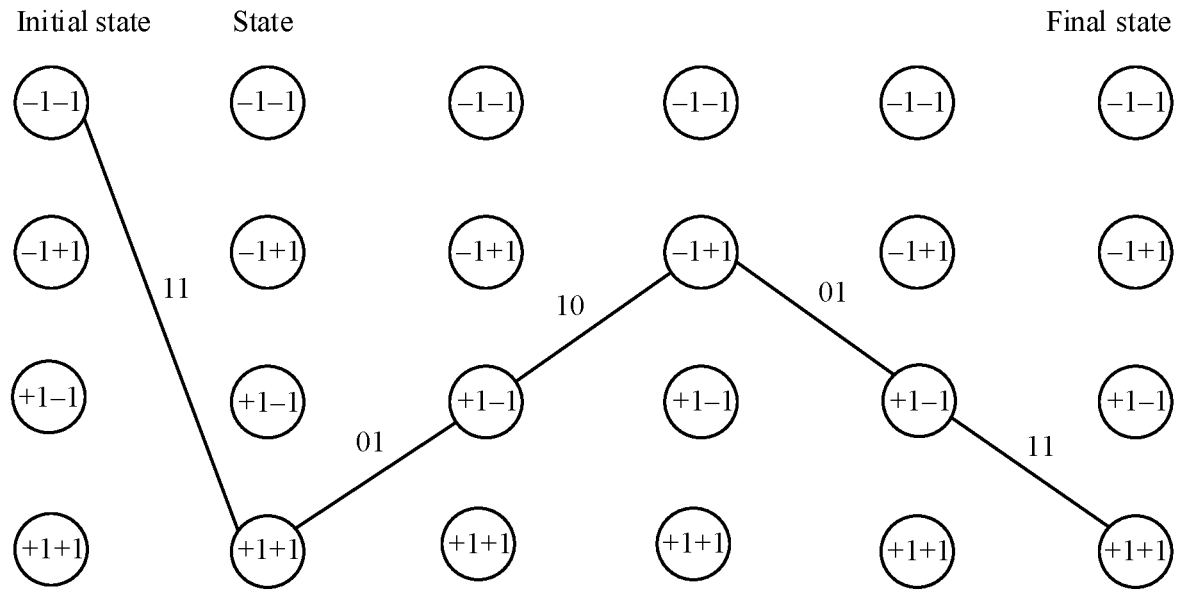
FIG. 11 is a diagram of state transition according to an embodiment of this application.
Figure 12:
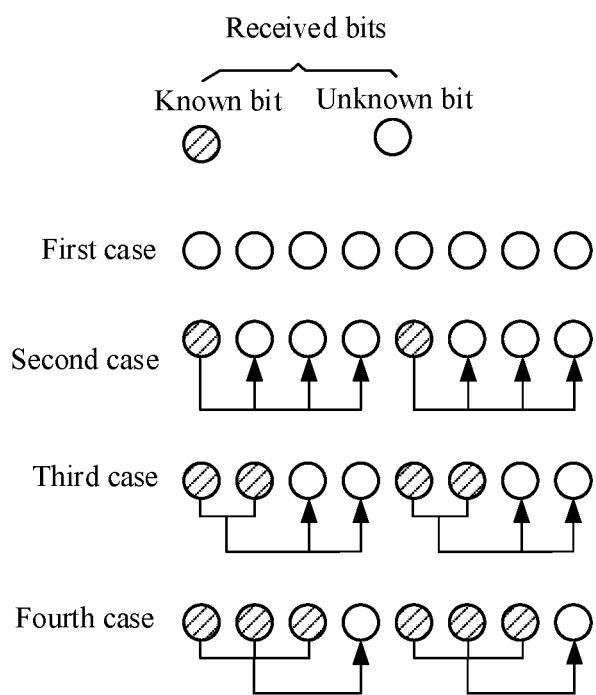
FIG. 12 is a principle diagram of a multi-symbol detector according to an embodiment of this application.

It should be noted that, in this embodiment of this application, the multi-symbol detector may perform multi-symbol detection based on a maximum-likelihood sequence detection (MLSD) technology. A main idea of the multi-symbol detector may be as follows: A process of transferring information on a channel is considered as a state transfer process. Information at any moment corresponds to one state. As shown in FIG. 11, a channel state is modeled as four states. The four states are a state −1−1, a state −1+1, a state +1−1, and a state +1+1. Data is sent to transfer the channel state. For example, an initial state of the channel is −1−1, and data 11 enables the channel to transfer from the state −1−1 to the state +1+1; data 01 enables the channel to transfer from the state +1+1 to the state +1−1; and the rest may be deduced by analogy. In a data transmission process, interference causes incorrect state transfer of the channel. A main function of the multi-symbol detector is to correct the incorrect state transfer in the data transmission process, so that correct data is recovered. FIG. 12 is a diagram of an operating principle of the multi-symbol detector according to this embodiment of this application. Referring to FIG. 12, the operating principle of the multi-symbol detector is described in four cases. In a first case, all received bits (received data bits) are unknown bits, and it is assumed that in this case, a bit error rate (BER) of performing multi-symbol detection processing by the multi-symbol detector is a BER 0. In a second case, assuming that in received bits, there is one known bit (where the known bit is a correct bit, and may be a bit fed back by the feedback module) in every four received bits, in this case, a bit error rate of performing multi-symbol detection processing by the multi-symbol detector is BER1. In a third case, assuming that in received bits, there are two known bits in every four received bits, in this case, a bit error rate of performing multi-symbol detection processing by the multi-symbol detector is BER2. In a fourth case, assuming that in received bits, there are three known bits in every four received bits, in this case, a bit error rate of performing the multi-symbol detection processing by the multi-symbol detector is BER3. BER0>BER1>BER2>BER3. Therefore, in this embodiment of this application, performing multi-symbol detection by the multi-symbol detector based on a fed back data flow can reduce a bit error rate of the multi-symbol detection. A final bit error rate of the signal transmission system provided in this embodiment of this application may be sum(BER0 to BER(N−1))/N superior to BER0. sum indicates summation, N indicates a quantity of feedback times, and BER(N−1) indicates a bit error rate of performing multi-symbol detection based on feedback performed for an $N^{th}$ time.

It should be noted that, in an actual application, the signal transmission system provided in this embodiment of this application may include a transmit end device and a receive end device. The encoder 05, the convolution module 04, and the DAC-07 may be functional units in a processor of the transmit end device. The coherent receiver 08, the ADC-09, the equalization module 01, the feedback module 03, the first decoder 02, the second decoder 06, and the decision device 10 each may be a functional unit in a processor of the receive end device.

In conclusion, according to the signal transmission system provided in this embodiment of this application, the equalization module includes the at least two multi-symbol detectors, the at least two multi-symbol detectors perform multi-symbol detection processing on the convolutional data flows based on the feedback data flow, and the feedback data flow is determined based on the decoded data flow. Therefore, a signal may be fed back and transmitted between the first decoder and the at least two multi-symbol detectors without a need to dispose a plurality of decoders and perform a plurality of iteration processes between the decoders and the multi-symbol detectors, so that a problem of relatively high signal transmission complexity is resolved, and signal transmission complexity can be reduced.

According to the signal transmission system provided in this embodiment of this application, auxiliary equalization on the multi-symbol detector is implemented through multiple-loop feedback, a bit error rate is reduced within limited complexity, system complexity is effectively reduced, and system performance is improved.

An embodiment of this application further provides a signal transmission method. The signal transmission method may be applied to the signal transmission system shown in FIG. 3 or FIG. 4. The signal transmission system includes an equalization module, a first decoder, and a feedback module. The equalization module is connected to the first decoder. The equalization module includes at least two multi-symbol detectors. The feedback module is connected to the first decoder and the at least two multi-symbol detectors. The signal transmission method includes the following steps.

Step S1: The equalization module performs equalization processing on a convolutional data flow to obtain an equalized data flow, where in a process in which the equalization module performs equalization processing on the convolutional data flow, each of the at least two multi-symbol detectors performs multi-symbol detection processing on a convolutional data flow input into the multi-symbol detector.

Step S2: The first decoder decodes the equalized data flow to obtain a decoded data flow.

Step S3: The feedback module determines a feedback data flow based on the decoded data flow, and feeds back the feedback data flow to the at least two multi-symbol detectors of the equalization module.

Step S4: The equalization module performs equalization processing on the convolutional data flow based on the feedback data flow, where in a process in which the equalization module performs equalization processing on the convolutional data flow, each of the at least two multi-symbol detectors performs, based on the feedback data flow fed back by the feedback module, multi-symbol detection processing on the convolutional data flow input into the multi-symbol detector.

Optionally, the signal transmission system further includes a convolution module. The convolution module, the equalization module, and the first decoder are sequentially connected. The signal transmission method further includes:

performing, by the convolution module, convolution processing on an encoded data flow input into the convolution module, to obtain the convolutional data flow.

The encoded data flow includes m encoded codewords in a one-to-one correspondence with m consecutive units of time, and each of the m encoded codewords includes k+1 encoded data blocks, where m>1, k>0, and both m and k are integers.

The convolutional data flow includes w convolutional codewords in a one-to-one correspondence with w consecutive units of time, where w=m+n*k, each of the w convolutional codewords includes k+1 convolutional data blocks, and each convolutional codeword includes one encoded data block in at least one of the m encoded codewords, where n>0, and n is an integer.

The equalized data flow includes g equalized codewords in a one-to-one correspondence with g consecutive units of time, where g=m+2n*k. Each of the g equalized codewords includes k+1 equalized data blocks. In the g equalized codewords, m equalized codewords corresponding to the m consecutive units of time are in a one-to-one correspondence with the m encoded codewords. Each of the m equalized codewords includes equalized data blocks obtained after convolution processing and equalization processing are sequentially performed on all the encoded data blocks in the corresponding encoded codeword.

The decoded data flow includes g decoded codewords in a one-to-one correspondence with the g consecutive units of time. The g decoded codewords are obtained by decoding the g equalized codewords. Each of the g decoded codewords includes k+1 decoded data blocks.

Optionally, the convolution modules include a first block divider, a first combiner, and k first delayers. The k first delayers are sequentially connected in series, and the first block divider, the k first delayers, and the first combiner are sequentially connected in series. An output end of each of the k first delayers is connected to an input end of the first combiner. An input end of the $1^{st}$ first delayer in the k first delayers is connected to the input end of the first combiner.

The performing, by the convolution module, convolution processing on an encoded data flow input into the convolution module, to obtain the convolutional data flow includes:

dividing, by the first block divider, each of the m encoded codewords into the k+1 encoded data blocks, inputting one of the k+1 encoded data blocks into the first combiner, and inputting k encoded data blocks into the $1^{st}$ first delayer;

delaying, by each of the k first delayers by n units of time, p encoded data blocks input into the first delayer, to obtain p delayed encoded data blocks, inputting one of the p delayed encoded data blocks into the first combiner, and inputting p−1 delayed encoded data blocks into a next first delayer connected to the first delayer, where 1≤p≤k, and p is an integer; and combining, by the first combiner, encoded data blocks that correspond to the m encoded codewords and that are input into the first combiner, to obtain the convolutional data flow.

Optionally, the combining, by the first combiner, encoded data blocks that correspond to the m encoded codewords and that are input into the first combiner, to obtain the convolutional data flow includes: combining, by the first combiner in chronological order, the encoded data blocks that correspond to the m encoded codewords and that are input into the first combiner, to obtain the convolutional data flow. The convolutional data flow includes the w convolutional codewords. In the w convolutional codewords:

n*k convolutional codewords corresponding to the first n*k units of time in the w units of time include k convolutional codeword groups, each convolutional codeword group includes n convolutional codewords, and each convolutional codeword includes i first convolutional data blocks and k+1−i second convolutional data blocks, where each of the i first convolutional data blocks is an encoded data block in i of n*i encoded codewords corresponding to the first n*i units of time in the m units of time, the i first convolutional data blocks are from the i encoded codewords in a one-to-one correspondence manner, and the k+1−i second convolutional data blocks are initial data blocks, where k≤i>0, and i is an integer;

n*k convolutional codewords corresponding to the last n*k units of time in the w units of time include k convolutional codeword groups, each convolutional codeword group includes n convolutional codewords, and each convolutional codeword includes k+1−j first convolutional data blocks and j second convolutional data blocks, where each of the k+1−j first convolutional data blocks is an encoded data block in k+1−j of n*j encoded codewords corresponding to the last n*j units of time in the m units of time, the k+1−j first convolutional data blocks are from the k+1−j encoded codewords in a one-to-one correspondence manner, and the j second encoded data blocks are the initial data blocks, where k≤j>0, and j is an integer; and A convolutional codeword corresponding to each of at least one intermediate unit of time includes k+1 first convolutional data blocks. Each of the k+1 first convolutional data blocks is an encoded data block in k+1 of the m encoded codewords. The k+1 first convolutional data blocks are from the k+1 encoded codewords in a one-to-one correspondence manner. The intermediate unit of time is a unit of time other than the first n*k units of time and the last n*k units of time in the w units of time.

Optionally, the equalization module includes a second combiner, k second delayers, k+1 multi-symbol detectors, k+1 second block dividers, and k+1 first data extractors. Output ends of the k+1 multi-symbol detectors are connected to input ends of the k+1 second block dividers in a one-to-one correspondence manner. Output ends of the k+1 second block dividers are connected to input ends of the k+1 first data extractors in a one-to-one correspondence manner.

An output end of each of the k+1 first data extractors is connected to an input end of the second combiner. The k second delayers are sequentially connected in series, and output ends of the k second delayers are connected to input ends of k of the k+1 multi-symbol detectors in a one-to-one correspondence manner. An input end of the $1^{st}$ second delayer in the k second delayers is connected to an input end of a multi-symbol detector other than the k multi-symbol detectors in the k+1 multi-symbol detectors. The input end of the $1^{st}$ second delayer is further connected to the convolution module.

The signal transmission method further includes: separately inputting, by the convolution module, the convolutional data flow into the $1^{st}$ second delayer and the multi-symbol detector connected to the input end of the $1^{st}$ second delayer. Step S4 includes:

delaying, by each of the k second delayers by n units of time, a convolutional data flow input into the second delayer, to obtain a delayed convolutional data flow, and separately inputting the delayed convolutional data flow into a multi-symbol detector and a next second delayer that are connected to the second delayer, where each delayed convolutional data flow includes w delayed convolutional codewords in a one-to-one correspondence with the w consecutive units of time;

performing, by each of the k+1 multi-symbol detectors, multi-symbol detection processing on the convolutional data flow input into the multi-symbol detector, to obtain a multi-symbol detected convolutional data flow, and inputting the multi-symbol detected convolutional data flow into a second block divider connected to the multi-symbol detector, where each multi-symbol detected convolutional data flow includes w multi-symbol detected convolutional codewords in a one-to-one correspondence with the w consecutive units of time;

dividing, by each of the k+1 second block dividers, each multi-symbol convolutional codeword in the multi-symbol detected convolutional data flow input into the second block divider into k+1 convolutional data blocks, to obtain k+1 convolutional data block flows, and inputting the k+1 convolutional data block flows into a first data extractor connected to the second block divider;

extracting, by each of the k+1 first data extractors, a target convolutional data block flow from the k+1 convolutional data block flows input into the first data extractor, and inputting the extracted target convolutional data block flow into the second combiner; and combining, by the second combiner, k+1 target convolutional data block flows input into the second combiner, to obtain the equalized data flow.

Optionally, the combining, by the second combiner, k+1 target convolutional data block flows input into the second combiner, to obtain the equalized data flow includes: combining, by the second combiner in chronological order, the k+1 target convolutional data block flows input into the second combiner, to obtain the equalized data flow. The equalized data flow includes the k+1 target convolutional data block flows. Each target convolutional data block flow includes one equalized data block in each of the g equalized codewords. In the g equalized codewords:

an equalized codeword corresponding to each of the first n*k units of time and the last n*k units of time in the g units of time includes k+1 initial data blocks; and an equalized codeword corresponding to each of at least one intermediate unit of time in the g units of time includes: equalized data blocks obtained after convolution processing and equalization processing are sequentially performed on k+1 encoded data blocks in a corresponding encoded codeword. The intermediate unit of time is a unit of time other than the first n*k units of time and the last n*k units of time in the g units of time.

Optionally, the feedback module includes k third delayers. The k third delayers are sequentially connected in series. An output end of the first decoder is connected to an input end of the $1^{st}$ third delayer in the k third delayers. An output end of a $q^{th}$ third delayer in the k third delayers is connected to input ends of k+1−q of the k+1 multi-symbol detectors. The k+1−q multi-symbol detectors are multi-symbol detectors connected to output ends of the last k+1−q second delayers in the k second delayers.

Step S3 includes: delaying, by each of the k third delayers by n units of time, a decoded data flow input into the third delayer, to obtain a delayed decoded data flow, and inputting the delayed decoded data flow into a multi-symbol detector and a next third delayer that are connected to the third delayer, where each of the k+1 multi-symbol detectors is configured to perform, based on a delayed decoded data flow fed back by a third delayer connected to the multi-symbol detector, multi-symbol detection processing on the convolutional data flow input into the multi-symbol detector.

Optionally, the decoded data flow includes k+1 decoded data block flows. The k+1 decoded data block flows are obtained by the first decoder by decoding the k+1 target convolutional data block flows in the equalized data flow. The feedback module further includes an extrinsic information calculator and k second data extractors. An input end of the extrinsic information calculator is connected to the output end of the first decoder and an input end of the first decoder. An output end of the extrinsic information calculator is connected to the $1^{st}$ third delayer in the k third delayers. Each of the k third delayers is connected to an input end of a corresponding multi-symbol detector by using one second data extractor. Step S3 includes:

calculating, by the extrinsic information calculator, an extrinsic information flow of the first decoder based on the decoded data flow output by the first decoder and the equalized data flow input into the first decoder, where the extrinsic information flow includes k+1 extrinsic information block flows, and the k+1 extrinsic information block flows are calculated by the extrinsic information calculator based on the k+1 decoded data block flows and the k+1 target convolutional data block flows;

delaying, by each of the k third delayers by n units of time, an extrinsic information flow input into the third delayer, to obtain a delayed extrinsic information flow, and inputting the delayed extrinsic information flow into a second data extractor and a next third delayer that are connected to the third delayer, where each delayed extrinsic information flow includes k+1 delayed extrinsic information block flows;

extracting, by each of the k second data extractors, a target delayed extrinsic information block flow from k+1 delayed extrinsic information block flows of a delayed extrinsic information flow input into the second data extractor, and inputting the extracted target delayed extrinsic information block flow into a multi-symbol detector connected to the second data extractor; and performing, by each of the k+1 multi-symbol detectors based on the target delayed extrinsic information block flow fed back by the second data extractor connected to the multi-symbol detector, multi-symbol detection processing on the convolutional data flow input into the multi-symbol detector.

Optionally, the dividing, by the first block divider, each of the m encoded codewords into the k+1 encoded data blocks, inputting one of the k+1 encoded data blocks into the first combiner, and inputting k encoded data blocks into the $1^{st}$ first delayer includes:

dividing, by the first block divider, each of the m encoded codewords into the k+1 encoded data blocks that are sequentially arranged, inputting the first encoded data block in the k+1 encoded data blocks into the first combiner, and inputting the second encoded data block to a $(k+1)^{th}$ encoded data block into the $1^{st}$ first delayer.

The delaying, by each of the k first delayers by n units of time, p encoded data blocks input into the first delayer, to obtain p delayed encoded data blocks, inputting one of the p delayed encoded data blocks into the first combiner, and inputting p−1 delayed encoded data blocks into a next first delayer connected to the first delayer includes:

delaying, by each of the k first delayers by n units of time, the p encoded data blocks that are input into the first delayer and that are sequentially arranged, to obtain the p delayed encoded data blocks, inputting the first delayed encoded data block in the p delayed encoded data blocks into the first combiner, and inputting the second delayed encoded data block to a $p^{th}$ delayed encoded data block into the next first delayer connected to the first delayer.

Optionally, data in the initial data blocks is 0.

Optionally, the signal transmission system further includes an encoder and a second decoder. The encoder is connected to the convolution module. The second decoder is connected to the first decoder. The signal transmission method further includes:

encoding, by the decoder, a data flow input into the encoder, to obtain the encoded data flow; and performing, by the second decoder, second decoding on the decoded data flow.

It should be noted that a specific implementation process of the signal transmission method provided in this embodiment of this application is described in detail in the embodiment of the signal transmission system. For the specific implementation process of the signal transmission method, refer to the foregoing system embodiment. Details are not described in this embodiment again. It should be further noted that, in an actual application, the signal transmission method provided in this application may be implemented by a processor by executing a program. In this case, the encoder, the convolution module, and a DAC may be functional units in a processor of a transmit end device. The processor of the transmit end device may implement, by executing a program, methods corresponding to the encoder, the convolution module, and the DAC in the foregoing method. A coherent receiver, an ADC, the equalization module, the feedback module, the first decoder, the second decoder, and a decision device may be functional units in a processor of a receive end device. The processor of the receive end device may implement, by executing a program, methods corresponding to the coherent receiver, the ADC, the equalization module, the feedback module, the first decoder, the second decoder, and the decision device in the foregoing method.

In conclusion, according to the signal transmission method provided in this embodiment of this application, the equalization module includes the at least two multi-symbol detectors, the at least two multi-symbol detectors perform multi-symbol detection processing on the convolutional data flow based on the feedback data flow, and the feedback data flow is determined based on the decoded data flow. Therefore, a signal may be fed back and transmitted between the first decoder and the at least two multi-symbol detectors without a need to dispose a plurality of decoders and perform a plurality of iteration processes between the decoders and the multi-symbol detectors, so that a problem of relatively high signal transmission complexity is resolved, and signal transmission complexity can be reduced.

A person of ordinary skill in the art may understand that all or some of the steps of the embodiments may be implemented by hardware or a program instructing related hardware. The program may be stored in a computer-readable storage medium. The storage medium may include: a read-only memory, a magnetic disk, an optical disc, or the like.

The foregoing descriptions are merely optional embodiments of this application, but are not intended to limit this application. Any modification, equivalent replacement, improvement, or the like made without departing from the spirit and principle of this application should fall within the protection scope of this application.

What is claimed is:

1. A signal transmission system, comprising:
an equalization module connected to a first decoder, the equalization module comprises at least two multi-symbol detectors, and wherein the equalization module is configured to perform equalization processing on a convolutional data flow to obtain an equalized data flow, wherein in a process in which the equalization module performs equalization processing on the convolutional data flow, each of the at least two multi-symbol detectors is configured to perform multi-symbol detection processing on the convolutional data flow input into a respective one of the at least two multi-symbol detectors;
the first decoder is configured to decode the equalized data flow to obtain a decoded data flow;
a feedback module, connected to the first decoder and the at least two multi-symbol detectors, configured to determine a feedback data flow based on the decoded data flow, and feed back the feedback data flow to the at least two multi-symbol detectors of the equalization module; and
the equalization module is further configured to perform equalization processing on the convolutional data flow based on the feedback data flow, wherein in a process in which the equalization module performs equalization processing on the convolutional data flow, each of the at least two multi-symbol detectors is configured to perform, based on the feedback data flow fed back by the feedback module, multi-symbol detection processing on the convolutional data flow input into the respective one of the at least two multi-symbol detectors.

2. The signal transmission system according to claim 1, wherein the signal transmission system further comprises a convolution module, wherein the convolution module, the equalization module, and the first decoder are sequentially connected;
the convolution module is configured to perform convolution processing on an encoded data flow input into the convolution module, to obtain the convolutional data flow;
the encoded data flow comprises m encoded codewords in a one-to-one correspondence with m consecutive units of time, and each of the m encoded codewords comprises k+1 encoded data blocks, wherein m>1, k>0, and both m and k are integers;
the convolutional data flow comprises w convolutional codewords in a one-to-one correspondence with w consecutive units of time, wherein w=m+n*k, each of the w convolutional codewords comprises k+1 convolutional data blocks, and each convolutional codeword comprises one encoded data block in at least one of the m encoded codewords, wherein n>0, and n is an integer;

the equalized data flow comprises g equalized codewords in a one-to-one correspondence with g consecutive units of time, wherein g=m+2n*k, each of the g equalized codewords comprises k+1 equalized data blocks, in the g equalized codewords, m equalized codewords corresponding to the m consecutive units of time are in a one-to-one correspondence with the m encoded codewords, and each of the m equalized codewords comprises equalized data blocks obtained after convolution processing and equalization processing are sequentially performed on all the encoded data blocks in a corresponding encoded codeword; and the decoded data flow comprises g decoded codewords in a one-to-one correspondence with the g consecutive units of time, the g decoded codewords are obtained by decoding the g equalized codewords, and each of the g decoded codewords comprises k+1 decoded data blocks.

3. The signal transmission system according to claim 2, wherein the convolution module comprises a first block divider, a first combiner, and k first delayers, wherein the k first delayers are sequentially connected in series, the first block divider, the k first delayers, and the first combiner are sequentially connected in series, an output end of each of the k first delayers is connected to an input end of the first combiner, and an input end of a $1^{st}$ first delayer in the k first delayers is connected to the input end of the first combiner;

the first block divider is configured to: divide each of the m encoded codewords into the k+1 encoded data blocks, input one of the k+1 encoded data blocks into the first combiner, and input k encoded data blocks into the 1st first delayer;

each of the k first delayers is configured to: delay, by n units of time, p encoded data blocks input into the first delayer, to obtain p delayed encoded data blocks, input one of the p delayed encoded data blocks into the first combiner, and input p−1 delayed encoded data blocks into a next first delayer connected to the first delayer, wherein 1≤p≤k, and p is an integer; and the first combiner is configured to combine encoded data blocks that correspond to the m encoded codewords and that are input into the first combiner, to obtain the convolutional data flow.

4. The signal transmission system according to claim 3, wherein the first block divider is specifically configured to: divide each of the m encoded codewords into the k+1 encoded data blocks that are sequentially arranged, input the first encoded data block in the k+1 encoded data blocks into the first combiner, and input the second encoded data block to a $(k+1)^{th}$ encoded data block into the $1^{st}$ first delayer; and each of the k first delayers is specifically configured to: delay, by n units of time, the p encoded data blocks input into the first delayer that are sequentially arranged, to obtain the p delayed encoded data blocks, input the first delayed encoded data block in the p delayed encoded data blocks into the first combiner, and input the second delayed encoded data block to a $p^{th}$ delayed encoded data block into the next first delayer connected to the first delayer.

5. The signal transmission system according to claim 3, wherein the first combiner is configured to combine, in a chronological order, the encoded data blocks that correspond to the m encoded codewords and that are input into the first combiner, to obtain the convolutional data flow, wherein the convolutional data flow comprises the w convolutional codewords; and in the w convolutional codewords:

n*k convolutional codewords corresponding to first n*k units of time in w units of time comprise k convolutional codeword groups, each convolutional codeword group comprises n convolutional codewords, and each convolutional codeword comprises i first convolutional data blocks and k+1−i second convolutional data blocks, wherein each of the i first convolutional data blocks is an encoded data block in i of n*i encoded codewords corresponding to first n*i units of time in m units of time, the i first convolutional data blocks are from the i encoded codewords in a one-to-one correspondence manner, and the k+1−i second convolutional data blocks are initial data blocks, wherein k≥i>0, and i is an integer;

n*k convolutional codewords corresponding to last n*k units of time in the w units of time comprise k convolutional codeword groups, each convolutional codeword group comprises n convolutional codewords, and each convolutional codeword comprises k+1−j first convolutional data blocks and j second convolutional data blocks, wherein each of the k+1−j first convolutional data blocks is an encoded data block in k+1−j of n*j encoded codewords corresponding to the last n*j units of time in the m units of time, the k+1−j first convolutional data blocks are from the k+1−j encoded codewords in a one-to-one correspondence manner, and the j second convolutional data blocks are initial data blocks, wherein k≥j>0, and j is an integer; and a convolutional codeword corresponding to each of at least one intermediate unit of time comprises k+1 first convolutional data blocks, each of the k+1 first convolutional data blocks is an encoded data block in k+1 of the m encoded codewords, the k+1 first convolutional data blocks are from the k+1 encoded codewords in a one-to-one correspondence manner, and the intermediate unit of time is a unit of time other than the first n*k units of time and the last n*k units of time in the w units of time.

6. The signal transmission system according to claim 5, wherein the equalization module comprises a second combiner, k second delayers, k+1 multi-symbol detectors, k+1 second block dividers, and k+1 first data extractors, wherein output ends of the k+1 multi-symbol detectors are connected to input ends of the k+1 second block dividers in a one-to-one correspondence manner, output ends of the k+1 second block dividers are connected to input ends of the k+1 first data extractors in a one-to-one correspondence manner, an output end of each of the k+1 first data extractors is connected to an input end of the second combiner, the k second delayers are sequentially connected in series, output ends of the k second delayers are connected to input ends of k of the k+1 multi-symbol detectors in a one-to-one correspondence manner, an input end of the $1^{st}$ second delayer in the k second delayers is connected to an input end of a multi-symbol detector other than the k multi-symbol detectors in the k+1 multi-symbol detectors, and the input end of the 1st second delayer is further connected to the convolution module;

the convolution module is configured to separately input the convolutional data flow into the $1^{st}$ second delayer and the multi-symbol detector connected to the input end of the $1^{st}$ second delayer;

each of the k second delayers is configured to: delay, by n units of time, a convolutional data flow input into the second delayer, to obtain a delayed convolutional data flow, and separately input the delayed convolutional data flow into a multi-symbol detector and a next second delayer that are connected to the second delayer, and each delayed convolutional data flow comprises w delayed convolutional codewords in a one-to-one correspondence with the w consecutive units of time;

each of the k+1 multi-symbol detectors is configured to: perform multi-symbol detection processing on the convolutional data flow input into the multi-symbol detector, to obtain a multi-symbol detected convolutional data flow, and input the multi-symbol detected convolutional data flow into a second block divider connected to the multi-symbol detector, and each multi-symbol detected convolutional data flow comprises w multi-symbol detected convolutional codewords in a one-to-one correspondence with the w consecutive units of time;

each of the k+1 second block dividers is configured to: divide each multi-symbol convolutional codeword in the multi-symbol detected convolutional data flow input into the second block divider into k+1 convolutional data blocks, to obtain k+1 convolutional data block flows, and input the k+1 convolutional data block flows into a first data extractor connected to the second block divider;

each of the k+1 first data extractors is configured to extract a target convolutional data block flow from the k+1 convolutional data block flows input into the first data extractor, and input the extracted target convolutional data block flow into the second combiner; and the second combiner is configured to combine k+1 target convolutional data block flows input into the second combiner, to obtain the equalized data flow.

7. The signal transmission system according to claim 6, wherein the second combiner is configured to combine, in a chronological order, the k+1 target convolutional data block flows input into the second combiner, to obtain the equalized data flow, and the equalized data flow comprises the k+1 target convolutional data block flows; and each target convolutional data block flow comprises one equalized data block in each of the g equalized codewords, wherein in the g equalized codewords:

an equalized codeword corresponding to each of the first n*k units of time and the last n*k units of time in the g units of time comprises k+1 initial data blocks; and an equalized codeword corresponding to each of at least one intermediate unit of time in the g units of time comprises: equalized data blocks obtained after convolution processing and equalization processing are sequentially performed on k+1 encoded data blocks in a corresponding encoded codeword, and the intermediate unit of time is a unit of time other than the first n*k units of time and the last n*k units of time in the g units of time.

8. The signal transmission system according to claim 7, wherein the feedback module comprises k third delayers;

the k third delayers are sequentially connected in series, an output end of the first decoder is connected to an input end of the $1^{st}$ third delayer in the k third delayers, an output end of a $q^{th}$ third delayer in the k third delayers is connected to input ends of k+1−q of the k+1 multi-symbol detectors, and the k+1−q multi-symbol detectors are multi-symbol detectors connected to output ends of the last k+1−q second delayers in the k second delayers;

each of the k third delayers is configured to: delay, by n units of time, a decoded data flow input into the third delayer, to obtain a delayed decoded data flow, and input the delayed decoded data flow into a multi-symbol detector and a next third delayer that are connected to the third delayer; and each of the k+1 multi-symbol detectors is configured to perform, based on a delayed decoded data flow fed back by a third delayer connected to the multi-symbol detector, multi-symbol detection processing on the convolutional data flow input into the multi-symbol detector.

9. The signal transmission system according to claim 8, wherein the decoded data flow comprises k+1 decoded data block flows, and the k+1 decoded data block flows are obtained by the first decoder by decoding the k+1 target convolutional data block flows in the equalized data flow;

the feedback module further comprises an extrinsic information calculator and k second data extractors, an input end of the extrinsic information calculator is connected to the output end of the first decoder and an input end of the first decoder, an output end of the extrinsic information calculator is connected to the $1^{st}$ third delayer in the k third delayers, and each of the k third delayers is connected to an input end of a corresponding multi-symbol detector by using one second data extractor; and the extrinsic information calculator is configured to calculate an extrinsic information flow of the first decoder based on the decoded data flow output by the first decoder and the equalized data flow input into the first decoder, the extrinsic information flow comprises k+1 extrinsic information block flows, and the k+1 extrinsic information block flows are calculated by the extrinsic information calculator based on the k+1 decoded data block flows and the k+1 target convolutional data block flows;

each of the k third delayers is configured to: delay, by n units of time, an extrinsic information flow input into the third delayer, to obtain a delayed extrinsic information flow, and input the delayed extrinsic information flow into a second data extractor and a next third delayer that are connected to the third delayer, and each delayed extrinsic information flow comprises k+1 delayed extrinsic information block flows;

each of the k second data extractors is configured to extract a target delayed extrinsic information block flow from k+1 delayed extrinsic information block flows of a delayed extrinsic information flow input into the second data extractor, and input the extracted target delayed extrinsic information block flow into a multi-symbol detector connected to the second data extractor; and each of the k+1 multi-symbol detectors is configured to perform, based on the target delayed extrinsic information block flow fed back by the second data extractor connected to the multi-symbol detector, multi-symbol detection processing on the convolutional data flow input into the multi-symbol detector.

10. The signal transmission system according to claim 7, wherein data in the initial data blocks is 0.

11. The signal transmission system according to claim 2, wherein the signal transmission system further comprises an encoder and a second decoder, wherein the encoder is connected to the convolution module, and the second decoder is connected to the first decoder;
the encoder is configured to encode a data flow input into the encoder, to obtain the encoded data flow; and
the second decoder is configured to perform second decoding on the decoded data flow.

12. A signal transmission method, comprising:
performing equalization processing on a convolutional data flow to obtain an equalized data flow, wherein in a process of performing equalization processing on the convolutional data flow, each of at least two multi-symbol detectors is configured to perform multi-symbol detection processing on the convolutional data flow input into a respective one of the at least two multi-symbol detector;
decoding the equalized data flow to obtain a decoded data flow;
determining a feedback data flow based on the decoded data flow; and
performing equalization processing on the convolutional data flow based on the feedback data flow, wherein in a process of performing equalization processing on the convolutional data flow, each of the at least two multi-symbol detectors is configured to perform, based on the feedback data flow, multi-symbol detection processing on the convolutional data flow input into a respective one of the at least two multi-symbol detectors.

13. The signal transmission method according to claim 12, wherein the signal transmission method further comprises:
performing convolution processing on an encoded data flow, to obtain the convolutional data flow, wherein
the encoded data flow comprises m encoded codewords in a one-to-one correspondence with m consecutive units of time, and each of the m encoded codewords comprises k+1 encoded data blocks, wherein m>1, k>0, and both m and k are integers;
the convolutional data flow comprises w convolutional codewords in a one-to-one correspondence with w consecutive units of time, wherein w=m+n*k, each of the w convolutional codewords comprises k+1 convolutional data blocks, and each convolutional codeword comprises one encoded data block in at least one of the m encoded codewords, wherein n>0, and n is an integer;
the equalized data flow comprises g equalized codewords in a one-to-one correspondence with g consecutive units of time, wherein g=m+2n*k, each of the g equalized codewords comprises k+1 equalized data blocks, in the g equalized codewords, m equalized codewords corresponding to the m consecutive units of time are in a one-to-one correspondence with the m encoded codewords, and each of the m equalized codewords comprises equalized data blocks obtained after convolution processing and equalization processing are sequentially performed on all the encoded data blocks in a corresponding encoded codeword; and
the decoded data flow comprises g decoded codewords in a one-to-one correspondence with the g consecutive units of time, the g decoded codewords are obtained by decoding the g equalized codewords, and each of the g decoded codewords comprises k+1 decoded data blocks.

14. The signal transmission method according to claim 13, wherein the performing convolution processing on an encoded data flow, to obtain the convolutional data flow comprises:
dividing each of the m encoded codewords into the k+1 encoded data blocks;
delaying p encoded data blocks by n units of time to obtain p delayed encoded data blocks, wherein 1≤p≤k and p is an integer; and
combining encoded data blocks corresponding to the m encoded codewords, to obtain the convolutional data flow.

15. The signal transmission method according to claim 14, wherein
the dividing each of the m encoded codewords into the k+1 encoded data blocks comprises:
dividing each of the m encoded codewords into the k+1 encoded data blocks that are sequentially arranged; and
the delaying p encoded data blocks by n units of time to obtain p delayed encoded data blocks comprises:
delaying, by n units of time, the p encoded data blocks that are sequentially arranged, to obtain the p delayed encoded data blocks.

16. The signal transmission method according to claim 14, wherein the combining encoded data blocks corresponding to the m encoded codewords to obtain the convolutional data flow comprises:
combining, in a chronological order, the encoded data blocks corresponding to the m encoded codewords, to obtain the convolutional data flow, wherein the convolutional data flow comprises the w convolutional codewords, wherein
in the w convolutional codewords:
n*k convolutional codewords corresponding to first n*k units of time in w units of time comprise k convolutional codeword groups, each convolutional codeword group comprises n convolutional codewords, and each convolutional codeword comprises i first convolutional data blocks and k+1−i second convolutional data blocks, wherein each of the i first convolutional data blocks is an encoded data block in i of n*i encoded codewords corresponding to first n*i units of time in m units of time, the i first convolutional data blocks are from the i encoded codewords in a one-to-one correspondence manner, and the k+1−i second convolutional data blocks are initial data blocks, wherein k≥i>0, and i is an integer;
n*k convolutional codewords corresponding to last n*k units of time in the w units of time comprise k convolutional codeword groups, each convolutional codeword group comprises n convolutional codewords, and each convolutional codeword comprises k+1−j first convolutional data blocks and j second convolutional data blocks, wherein each of the k+1−j first convolutional data blocks is an encoded data block in k+1−j of n*j encoded codewords corresponding to the last n*j units of time in the m units of time, the k+1−j first convolutional data blocks are from the k+1−j encoded codewords in a one-to-one correspondence manner, and the j second convolutional data blocks are initial data blocks, wherein k≥j>0, and j is an integer; and
a convolutional codeword corresponding to each of at least one intermediate unit of time comprises k+1 first convolutional data blocks, each of the k+1 first convolutional data blocks is an encoded data block in k+1 of the m encoded codewords, the k+1 first convolutional data blocks are from the k+1 encoded codewords in a one-to-one correspondence manner, and the intermediate unit of time is a unit of time other than the first n*k units of time and the last n*k units of time in the w units of time.

17. The signal transmission method according to claim 16, wherein the performing equalization processing on a convolutional data flow to obtain an equalized data flow comprises:
 delaying the convolutional data flow by n units of time to obtain a delayed convolutional data flow, wherein each delayed convolutional data flow comprises w delayed convolutional codewords in a one-to-one correspondence with the w consecutive units of time;
 performing multi-symbol detection processing on the convolutional data flow to obtain a multi-symbol detected convolutional data flow, wherein each multi-symbol detected convolutional data flow comprises w multi-symbol detected convolutional codewords in a one-to-one correspondence with the w consecutive units of time;
 dividing each multi-symbol convolutional codeword in the multi-symbol detected convolutional data flow into k+1 convolutional data blocks, to obtain k+1 convolutional data block flows;
 extracting a target convolutional data block flow from the k+1 convolutional data block flows of the multi-symbol convolutional codeword; and
 combining the target convolutional data block flows to obtain the equalized data flow.

18. The signal transmission method according to claim 17, wherein
 the combining the target convolutional data block flows to obtain the equalized data flow comprises:
 combining the k+1 target convolutional data block flows in a chronological order to obtain the equalized data flow, wherein the equalized data flow comprises the k+1 target convolutional data block flows, and each target convolutional data block flow comprises one equalized data block in each of the g equalized codewords, wherein
 in the g equalized codewords:
 an equalized codeword corresponding to each of the first n*k units of time and the last n*k units of time in the g units of time comprises k+1 initial data blocks; and
 an equalized codeword corresponding to each of at least one intermediate unit of time in the g units of time comprises: equalized data blocks obtained after convolution processing and equalization processing are sequentially performed on k+1 encoded data blocks in a corresponding encoded codeword, and the intermediate unit of time is a unit of time other than the first n*k units of time and the last n*k units of time in the g units of time.

19. The signal transmission method according to claim 18, wherein the determining a feedback data flow based on the decoded data flow comprises:
 delaying the decoded data flow by n units of time to obtain a delayed decoded data flow; and
 determining the delayed decoded data flow as the feedback data flow.

20. The signal transmission method according to claim 19, wherein the decoded data flow comprises k+1 decoded data block flows, and the k+1 decoded data block flows are obtained by decoding the k+1 target convolutional data block flows in the equalized data flow; and
 the determining a feedback data flow based on the decoded data flow comprises:
 calculating an extrinsic information flow based on the decoded data flow and the equalized data flow, wherein the extrinsic information flow comprises k+1 extrinsic information block flows, and the k+1 extrinsic information block flows are calculated based on the k+1 decoded data block flows and the k+1 target convolutional data block flows;
 delaying the extrinsic information flow by n units of time to obtain a delayed extrinsic information flow; and
 determining the delayed extrinsic information flow as the feedback data flow.

* * * * *